(12) United States Patent
Iwane

(10) Patent No.: US 8,111,311 B2
(45) Date of Patent: Feb. 7, 2012

(54) IMAGE SENSING DEVICE AND IMAGE SENSING SYSTEM

(75) Inventor: Masaaki Iwane, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 281 days.

(21) Appl. No.: 12/574,258

(22) Filed: Oct. 6, 2009

(65) Prior Publication Data

US 2010/0097486 A1 Apr. 22, 2010

(30) Foreign Application Priority Data

Oct. 17, 2008 (JP) .................................. 2008-269183

(51) Int. Cl.
*H04N 5/335* (2011.01)
*H01L 31/062* (2006.01)

(52) U.S. Cl. ........................................ 348/294; 257/291
(58) Field of Classification Search .................. 348/294, 348/324; 257/291, 292
See application file for complete search history.

(56) References Cited

U.S. PATENT DOCUMENTS

| 5,955,753 | A | 9/1999 | Takahashi ..................... 257/292 |
| 7,005,310 | B2 * | 2/2006 | Hanada et al. .................. 438/25 |
| 7,193,258 | B2 * | 3/2007 | Hara et al. ..................... 257/291 |
| 7,436,010 | B2 | 10/2008 | Mori et al. ..................... 257/292 |
| 7,619,267 | B2 * | 11/2009 | Araki ............................. 257/292 |
| 7,973,271 | B2 * | 7/2011 | Toumiya et al. ........... 250/208.1 |
| 2006/0054946 | A1 * | 3/2006 | Baek et al. ..................... 257/292 |
| 2007/0004202 | A1 * | 1/2007 | Fujii .............................. 438/678 |
| 2007/0212804 | A1 * | 9/2007 | Sasaki et al. .................... 438/29 |
| 2008/0029787 | A1 | 2/2008 | Watanabe et al. ............. 257/233 |
| 2010/0002117 | A1 | 1/2010 | Iwane et al. .................. 348/308 |

FOREIGN PATENT DOCUMENTS

| JP | 9-046596 A | 2/1997 |
| JP | 2005-167958 A | 6/2005 |

\* cited by examiner

*Primary Examiner* — Trung Diep
(74) *Attorney, Agent, or Firm* — Fitzpatrick, Cella, Harper & Scinto

(57) ABSTRACT

An image sensing device includes a multilayer wiring structure comprising a first wiring layer and a second wiring layer. The second wiring layer comprises a plurality of vertical signal lines extending in the vertical direction among a plurality of photoelectric conversion units of a pixel unit to transfer the signal output by an amplification transistor and a plurality of vertical power supply lines extending in the vertical direction between two pixel units adjacent to each other in the horizontal direction to supply a power supply voltage to the amplification transistor or the reset transistor. The vertical power supply lines supply the power supply voltage to the reset transistor of the adjacent pixel unit on a first side in the horizontal direction and supply the power supply voltage to the amplification transistor of the adjacent pixel unit on a second side in the horizontal direction.

7 Claims, 20 Drawing Sheets

F I G. 12
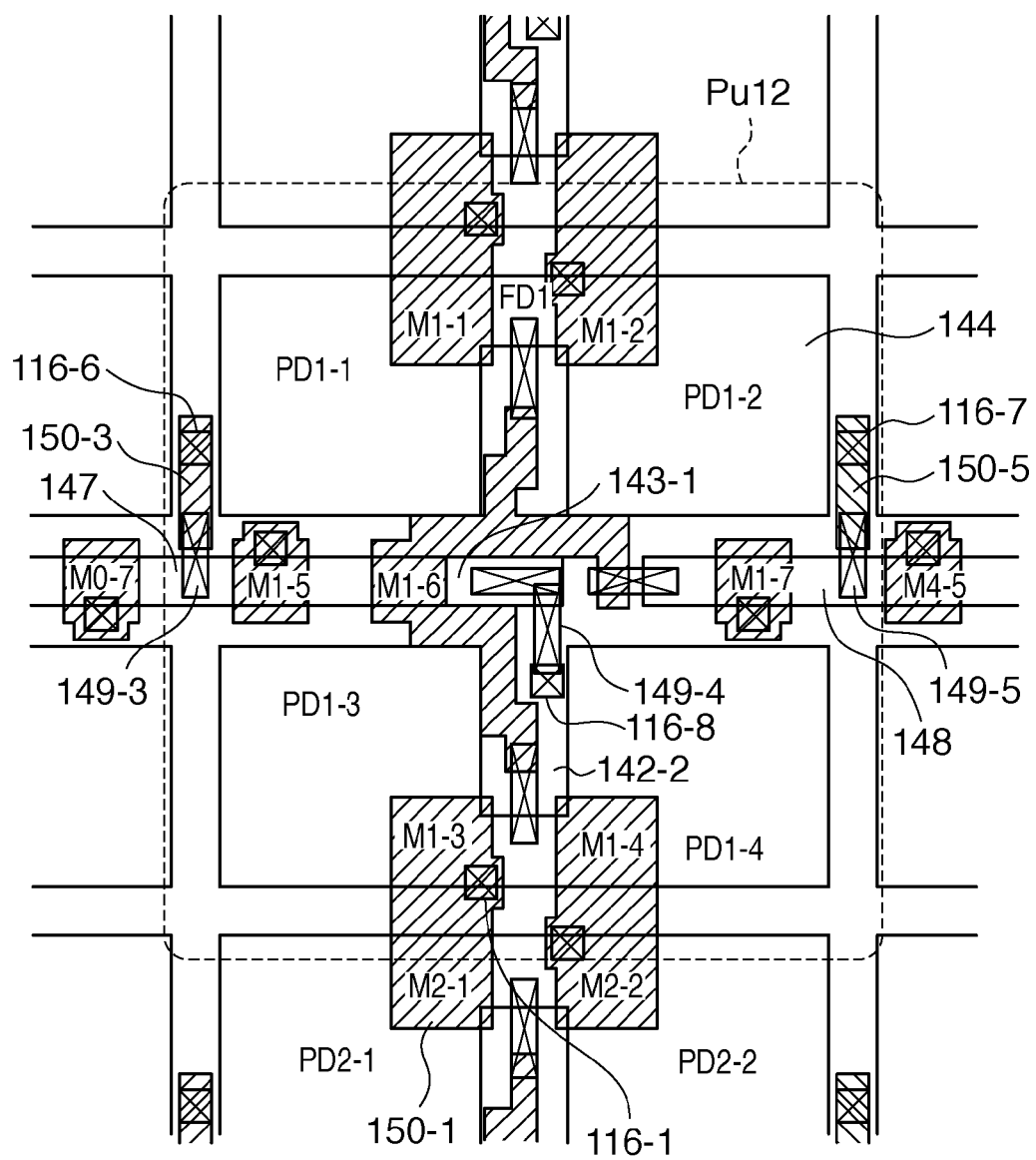

IMAGE SENSING DEVICE AND IMAGE SENSING SYSTEM

BACKGROUND OF THE INVENTION

1. Field of the Invention

The present invention relates to an image sensing device and image sensing system.

2. Description of the Related Art

In a CMOS sensor which is an image sensing device using a MOS transistor, multiple pixels are arranged two-dimensionally as disclosed in Japanese Patent Laid-Open No. 09-046596. In each pixel, as illustrated in FIG. 2 of Japanese Patent Laid-Open No. 09-046596, charges generated through photoelectric conversion by a photoelectric conversion unit 1 of a photodiode are transferred to a floating fusion unit (FD unit) 21 and consequently potential of the FD unit 21 changes. Each pixel amplifies a change in the potential of the FD unit 21 using a source-follower amplifier MOS transistor 5 and outputs the change as a signal to a vertical output line.

Japanese Patent Laid-Open No. 2005-167958 describes how the number of lines per photoelectric conversion cell (91 or 92) can be reduced when four PD units 2, 3, 6, and 7 share one FD unit 10 and one pixel amplifier MOS transistor 24 as shown in FIG. 1 of Japanese Patent Laid-Open No. 2005-167958.

Incidentally, the present inventor has found out the following new problem. What is at issue in reducing the pixels of a CMOS sensor is diffraction of light by wiring which defines an aperture region of a photodiode.

Specifically, the wiring which defines the aperture region of the photodiode is located above the photodiode, for example, via a transparent interlayer insulating film with a thickness on the order of a few hundred nm to a few μm. In this case, when pixel pitch is 2 μm or less and width of the aperture region is less than 2 to 3 times the incident wavelength, part of light incident upon a given pixel reaches the photodiode of an adjacent pixel after being diffracted by the wiring which defines the aperture region. This causes optical mixture of colors.

SUMMARY OF THE INVENTION

The present invention provides for reducing optical mixture of colors resulting from diffraction of light by wiring which defines an aperture region of a photodiode.

An image sensing device according to a first aspect of the present invention comprises: a semiconductor substrate which has an image sensing region on which a pixel unit array is placed with a plurality of pixel units arranged in a horizontal direction and a vertical direction, each of the plurality of pixel units having a plurality of photoelectric conversion units including at least two photoelectric conversion units adjacent to each other in the horizontal direction and two photoelectric conversion units adjacent to each other in the vertical direction, a charge-voltage converter which converts charges into voltage, a plurality of transfer transistors which transfer charges generated in the plurality of photoelectric conversion units to the charge-voltage converter, an amplification transistor which outputs a signal corresponding to voltage of the charge-voltage converter, and a reset transistor which resets the charge-voltage converter; and a multilayer wiring structure which defines an aperture region for each of the plurality of photoelectric conversion units in each of the plurality of pixel units, wherein the multilayer wiring structure comprises a first wiring layer placed above the semiconductor substrate so as to define contour sides in a horizontal direction of the aperture region for each of the plurality of photoelectric conversion units and a second wiring layer placed above the first wiring layer so as to define contour sides in a vertical direction of the aperture region for each of the plurality of photoelectric conversion units, the second wiring layer comprises a plurality of vertical signal lines extending in the vertical direction among the plurality of photoelectric conversion units of the pixel unit to transfer the signal output by the amplification transistor and a plurality of vertical power supply lines extending in the vertical direction between the two pixel units adjacent to each other in the horizontal direction to supply a power supply voltage to the amplification transistor or the reset transistor, and the vertical power supply lines supply the power supply voltage to the reset transistor of the adjacent pixel unit on a first side in the horizontal direction and supply the power supply voltage to the amplification transistor of the adjacent pixel unit on a second side in the horizontal direction.

An image sensing system according to a second aspect of the present invention comprises: the image sensing device according to the first aspect of the present invention; an optical system which forms an image on an image sensing surface of the image sensing device; and a signal processing unit which processes a signal output by the image sensing device and thereby generates image data.

The present invention can reduce optical mixture of colors resulting from diffraction of light by wiring which defines an aperture region of a photodiode.

Further features of the present invention will become apparent from the following description of exemplary embodiments with reference to the attached drawings.

BRIEF DESCRIPTION OF THE DRAWINGS

FIG. 12 is a plan view of a pixel unit PU12 according to a second embodiment of the present invention and its surroundings when viewed with a second wiring layer ML2, through-hole plugs 115, and a first wiring layer ML1 (see FIG. 3) removed;

DESCRIPTION OF THE EMBODIMENTS

First, problems to be solved by the present invention will be described in detail.

As described above, the present inventor has found out the following new problem. What is at issue in reducing the pixels of a CMOS sensor is diffraction of light by wiring which defines an aperture region of a photodiode.

The wiring which defines the aperture region of the photodiode is located above the photodiode, for example, via a transparent interlayer insulating film with a thickness on the order of a few hundred nm to a few μm. In this case, when pixel pitch is 2 μm or less and width of the aperture region is less than 2 to 3 times the incident wavelength, part of light incident upon a given pixel reaches the photodiode of an adjacent pixel after being diffracted by the wiring which defines the aperture region. This causes optical mixture of colors.

Paying attention to the fact that spreading of light caused by the diffraction increases with increasing distance from the wiring which causes the diffraction, the present inventor found that diffraction caused by wiring distant from the photodiode comes into question. Suppose, for example, a wiring layer of an image sensing region is formed only of first-layer wiring close to the photodiode and second-layer wiring distant from the photodiode. The present inventor suspected that it might be possible to reduce the diffraction spreading caused by the wiring which defines the aperture region and gather light on the photodiode by reducing the number of lines in the second-layer wiring distant from the photodiode and thereby widening the aperture region.

The present inventor also found the following problem. Specifically, a CMOS sensor with a small pixel pitch sometimes fails to gather light completely on the photodiode due to a diffraction limit of an on-chip microlens. For example, if wiring juts out to the light-receiving surface of the photodiode when the pixel is seen through in the direction of a normal to a light-receiving surface of the photodiode, the wiring will cause increased vignetting of light incident upon the photodiode. This may reduce sensitivity of the photodiode.

Furthermore, the present inventor found the following problem. If a Bayer color filter array is installed above the photodiode in each pixel, there can be sensitivity differences among adjacent pixels of the same color. The sensitivity differences, which are difficult to correct, will cause a reproduced image to contain luminance unevenness among the adjacent pixels, resulting in poor reproducibility.

Figure 1:
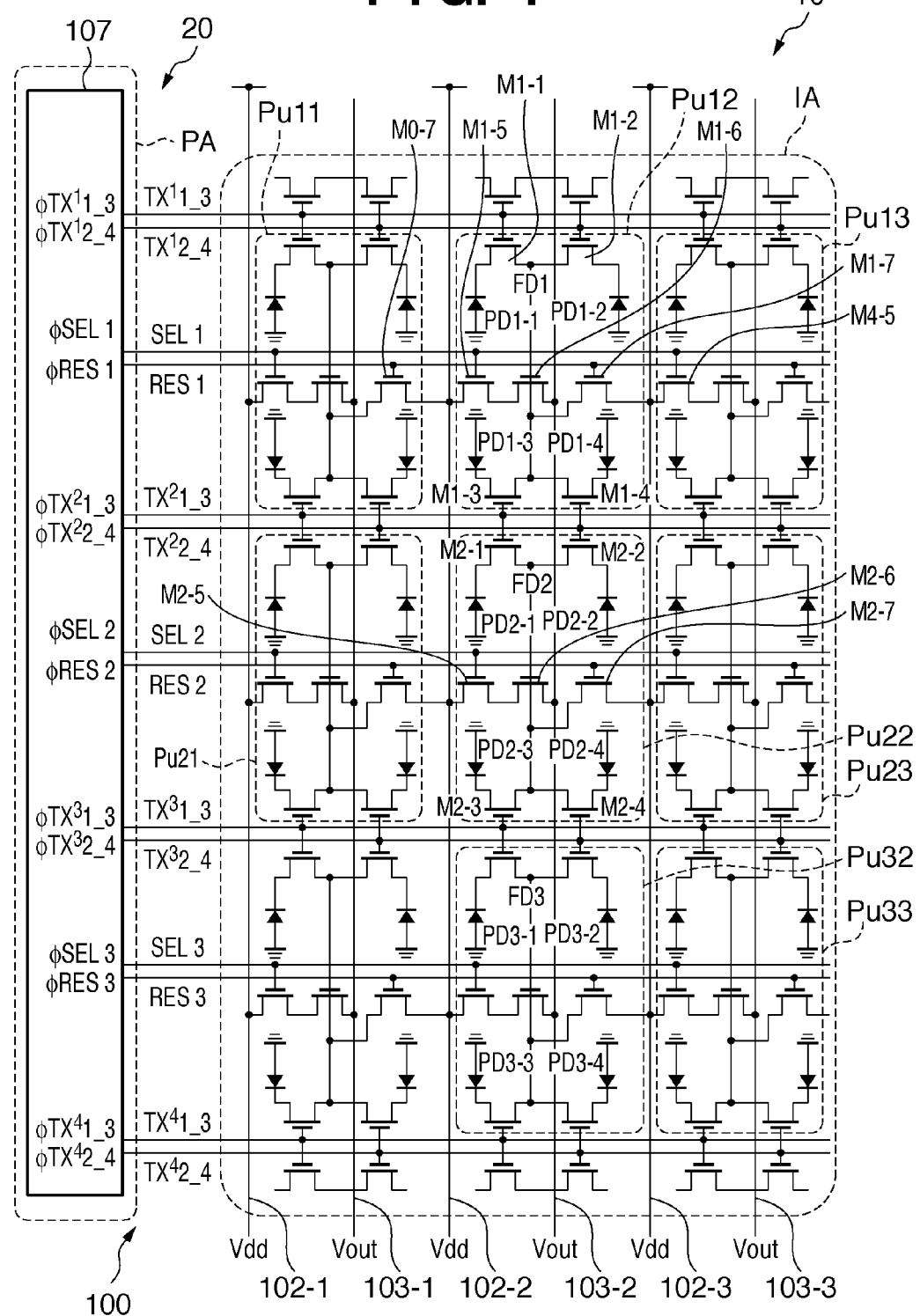
FIG. 1 is a diagram showing a circuit configuration of an image sensing device 100 according to a first embodiment of the present invention.

For example, if pixels (PD units) are arranged as shown in FIG. 1 of Japanese Patent Laid-Open No. 2005-167958, in the case of a single-plate CMOS area sensor, sensitivity differences occur among adjacent pixels of the same color. This is because when color filters are arranged in a Bayer array, normally color filters of the same color (e.g., red) are placed above a PD unit 5 and PD unit 7 located in the same column in FIG. 1 of Japanese Patent Laid-Open No. 2005-167958. That is, although light of the same color enters the PD unit 5 and PD unit 7, the PD unit 5 and PD unit 7 do not have the same layout. That is, a pixel amplification transistor 23 in which a signal generated by the PD unit 5 is input and a pixel amplification transistor 24 in which a signal generated by the PD unit 7 is input are connected to different output signal (VO) lines 38 and 39. Consequently, wiring layouts for PD units differ between the adjacent pixels (PD units) of the same color, causing a sensitivity difference between the signals output from the pixels. The sensitivity difference caused by the difference in layout increases around an image sensing region 201 shown in FIG. 17 of Japanese Patent Laid-Open No. 2005-167958. This causes a problem, namely, reduced reproducibility of an image shot in the image sensing region.

Figure 8:
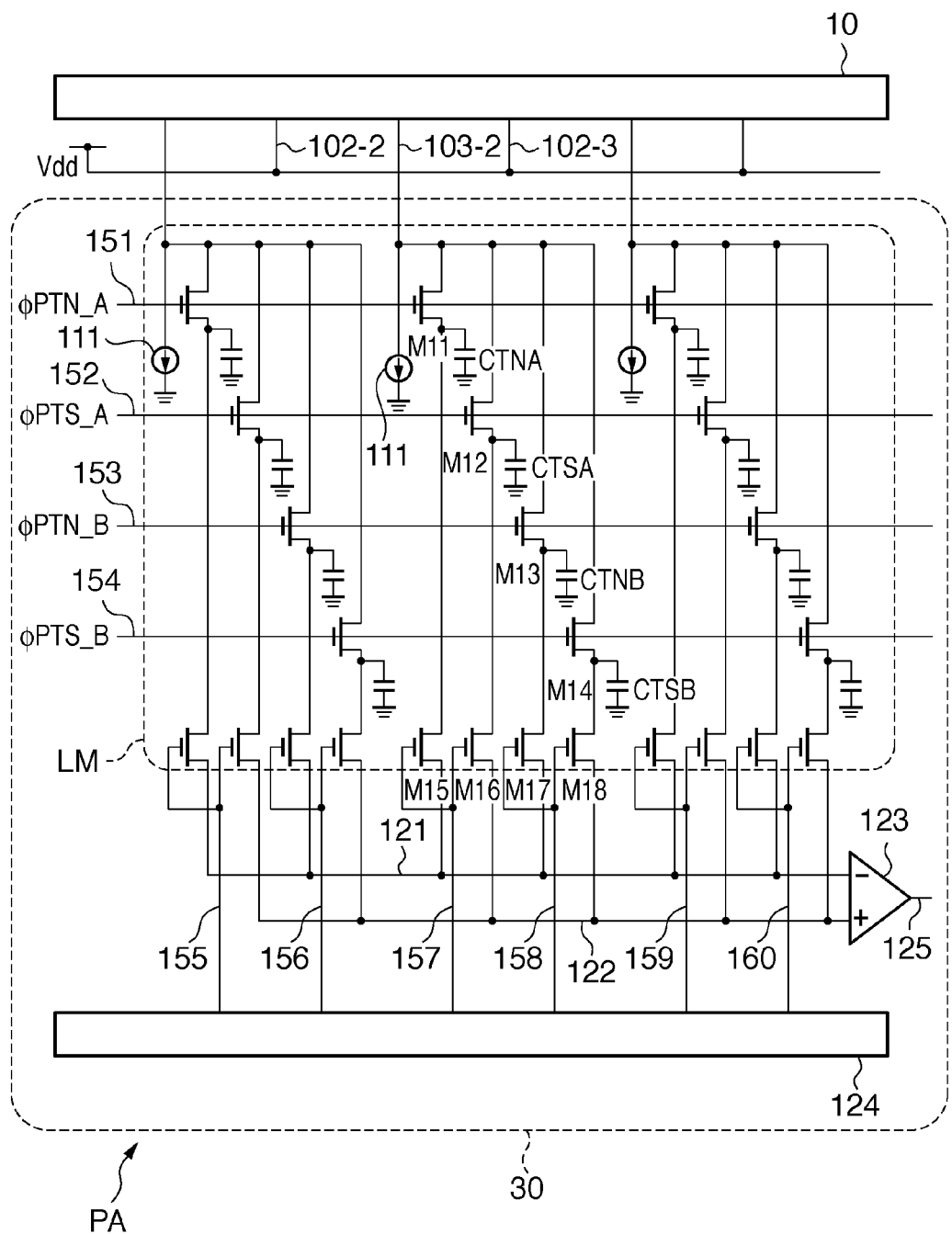
FIG. 8 is a diagram showing a circuit configuration of the image sensing device 100 according to the first embodiment of the present invention.

Next, a circuit configuration of the image sensing device 100 according to a first embodiment of the present invention will be described with reference to FIGS. 1 and 8. FIGS. 1 and 8 are diagrams showing a circuit configuration of the image sensing device 100 according to the first embodiment of the present invention.

The image sensing device 100 includes a pixel unit array 10, driving unit 20, and readout unit 30.

The pixel unit array 10 is placed in an image sensing region IA of a semiconductor substrate SB described later. The driving unit 20 and readout unit 30 are placed in a peripheral region PA of the semiconductor substrate SB. The peripheral region PA is located around the image sensing region IA.

In the pixel unit array 10, multiple pixel units PU11 to PU33 are arranged in a horizontal direction and vertical direction. FIG. 1 illustrates, by way of example, the pixel unit array 10 made up of 3 rows×3 columns of pixel units PU11 to PU33. The pixel units PU11 to PU33 are configured such that multiple pixels are partially shared with each other. FIG. 1 illustrates, by way of example, the pixel units PU11 to PU33 in which four pixels are partially shared with each other. That is, although FIG. 1 illustrates, by way of example, an image sensing region made up of 36 pixels arranged in 6 rows×6 columns, an actual image sensing region contains more than a few million pixels.

The driving unit 20 drives the pixel unit array 10. The driving unit 20 includes a vertical scanning circuit 107. The vertical scanning circuit 107 scans the pixel unit array 10 in the vertical direction, thereby selects a predetermined pixel row in the pixel unit array 10, and drives the pixels in the selected pixel row.

The readout unit 30 reads signals out of the pixel row selected from the pixel unit array 10 by the driving unit 20. The readout unit 30 includes a line memory LM, horizontal scanning circuit 124, and output amplifier 123. The line memory LM reads the signals out of the selected pixel row and temporarily holds the signals. The horizontal scanning circuit 124 selects signals column by column from the pixel row held by the line memory, and transfers the signals to the output amplifier 123. The output amplifier 123 generates an image signal from the signals transferred from the columns and outputs the image signal.

The line memory LM mainly includes two noise-level holding capacitances CTNA and CTNB as well as two luminance-level holding capacitances CTSA and CTSB for each vertical signal line (see FIG. 8). Each of the noise-level holding capacitances CTNA and CTNB holds a noise-level signal (described later). Each of the luminance-level holding capacitances CTSA and CTSB holds a luminance-level signal (described later).

Next, a circuit configuration of the pixel unit array 10 will be described. Although a configuration of the pixel unit PU12 will be described by way of example, the other pixel units PU11 to PU33 have the similar configuration to the pixel unit PU12.

The pixel unit PU12 includes multiple photoelectric conversion units PD1-1 to PD1-4, a charge-voltage converter FD1, multiple transfer transistors M1-1 to M1-4, an amplification transistor M1-6, a select transistor M1-5, and a reset transistor M1-7. In the pixel unit PU12, the charge-voltage converter FD1, reset transistor M1-7, amplification transistor M1-6, and select transistor M1-5 are shared by the four photoelectric conversion units PD1-1 to PD1-4 and four transfer transistors M1-1 to M1-4.

The photoelectric conversion units PD1-1 to PD1-4 generate and accumulate charges according to light. The photoelectric conversion units PD1-1 to PD1-4 are, for example, photodiodes.

The multiple transfer transistors M1-1 to M1-4 transfer the charges generated by the multiple photoelectric conversion units PD1-1 to PD1-4 to the charge-voltage converter FD1. Specifically, the transfer transistor M1-1 turns on when an active control signal is supplied from the vertical scanning circuit 107 to its gate via a transfer control line $TX^1 1\_3$, and thereby transfers the charges generated by the photoelectric conversion unit PD1-1 to the charge-voltage converter FD1. The transfer transistor M1-2 turns on, when an active control signal is supplied from the vertical scanning circuit 107 to its gate via a transfer control line $TX^1 2\_4$, and thereby transfers the charges generated by the photoelectric conversion unit PD1-2 to the charge-voltage converter FD1. The transfer transistor M1-3 turns on, when an active control signal is supplied from the vertical scanning circuit 107 to its gate via a transfer control line $TX^2 1\_3$, and thereby transfers the charges generated by the photoelectric conversion unit PD1-3 to the charge-voltage converter FD1. The transfer transistor M1-4 turns on, when an active control signal is supplied from the vertical scanning circuit 107 to its gate via a transfer control line $TX^2 2\_4$, and thereby transfers the charges generated by the photoelectric conversion unit PD1-4 to the charge-voltage converter FD1.

The charges-voltage converter FD1 converts the transferred charges into voltage. The charge-voltage converter FD1 is, for example, a floating diffusion.

The reset transistor M1-7 resets the charge-voltage converter FD1. That is, the reset transistor M1-7 turns on when an active control signal is supplied to its gate from the vertical scanning circuit 107 via a reset control line RES1. Consequently, the reset transistor M1-7 resets the charge-voltage converter FD1 to a potential corresponding to a power supply voltage Vdd supplied to its drain from a vertical power supply line 102-3.

The amplification transistor M1-6 outputs a signal corresponding to a voltage of the charge-voltage converter FD1. The amplification transistor M1-6 performs a source-follower operation, together with a load current supply 111 connected to the vertical signal line 103-2, according to the power supply voltage Vdd supplied to its drain from the vertical power supply line 102-2. Consequently, the amplification transistor M1-6 outputs a signal corresponding to the voltage of the charge-voltage converter FD1 to the vertical signal line 103-2. The amplification transistor M1-6 outputs a noise-level signal corresponding to the voltage of the charge-voltage converter FD1 to the vertical signal line 103-2 in a state where the charge-voltage converter FD1 has been reset by the reset transistor M1-7. The amplification transistor M1-6 outputs a luminance-level signal corresponding to the voltage of the charge-voltage converter FD1 to the vertical signal line 103-2 in a state where the charges generated by the photoelectric conversion units PD1-1 to PD1-4 have been transferred to the charge-voltage converter FD1 by the transfer transistors M1-1 to M1-4.

The select transistor M1-5 puts the pixel unit PU12 in a selected state/deselected state. That is, the select transistor M1-5 turns on/off when an active/non-active control signal is supplied from the vertical scanning circuit 107 via a select control line SEL1, and thereby puts the pixel unit PU12 in a selected/deselected state.

Figure 3:
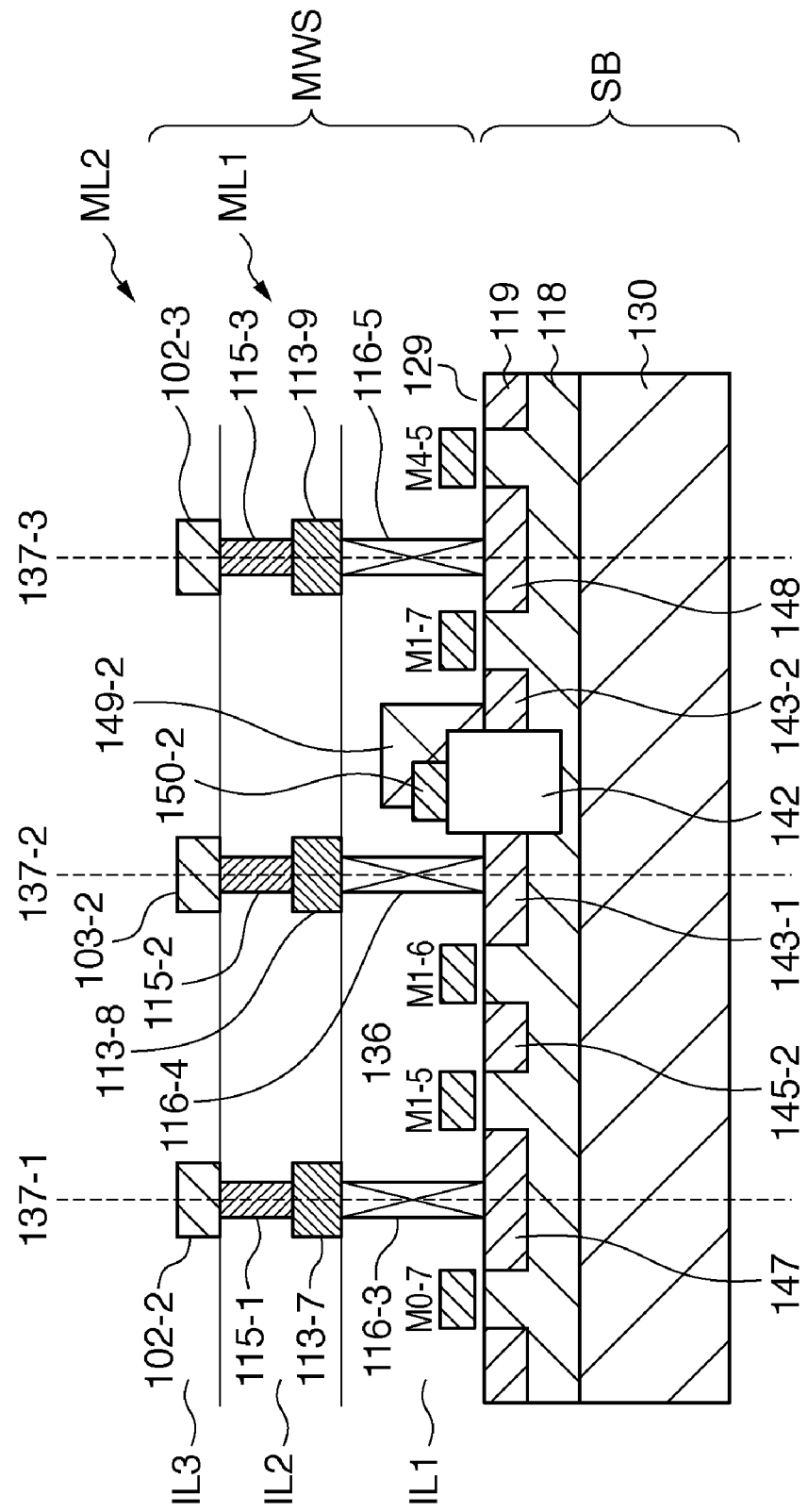
FIG. 3 is a sectional view taken along line B-B' in the plan view of FIG. 2.

Next, a cross-sectional configuration of the image sensing device 100 will be outlined with reference to FIG. 3.

The image sensing device 100 includes the semiconductor substrate SB and a multilayer wiring structure MWS. The semiconductor substrate SB has the image sensing region IA and peripheral region PA. The multilayer wiring structure MWS includes a first insulating layer IL1, first wiring layer ML1, second insulating layer IL2, second wiring layer ML2, and third insulating layer IL3.

The first insulating layer IL1 is placed on the semiconductor substrate SB. The first insulating layer IL1 insulates the semiconductor substrate SB and first wiring layer ML1 from each other.

The first wiring layer ML1 is placed above the first insulating layer IL1 and thus the semiconductor substrate SB so as to define contour sides in a horizontal direction of an aperture region for each of the multiple photoelectric conversion units. The first wiring layer ML1 defines, for example, contour sides OAS1 and OAS2 in the horizontal direction of the aperture region OA for the photoelectric conversion unit PD1-2 (see FIG. 5). The first wiring layer ML1 is made, for example, of a metal or intermetallic compound composed principally of aluminum.

The second insulating layer IL2 is placed on the first wiring layer ML1 so as to cover the first wiring layer ML1. The second insulating layer IL2 insulates the first wiring layer ML1 and second wiring layer ML2 from each other.

The second wiring layer ML2 is placed above the second insulating layer IL2 and thus the first wiring layer ML1 so as to define contour sides in a vertical direction of the aperture region for each of the multiple photoelectric conversion units. The second wiring layer ML2 defines, for example, contour sides OAS3 and OAS4 in the vertical direction of the aperture region OA for the photoelectric conversion unit PD1-2 (see FIG. 5). The second wiring layer ML2 is the uppermost wiring layer in the image sensing region IA. The second wiring layer ML2 is made, for example, of a metal or intermetallic compound composed principally of aluminum.

The third insulating layer IL3 is placed on the second wiring layer ML2 so as to cover the second wiring layer ML2. The third insulating layer IL3 insulates the second wiring layer ML2 from upper layers (interlayer lens, planarizing layer, and the like).

Next, lines extending in the horizontal direction between the pixel unit array 10 and driving unit 20 will be described with reference to FIG. 1.

Reference characters $TX^1 1\_3$, $TX^1 2\_4$, $TX^1 1\_3$, $TX^2 2\_4$, $TX^3 1\_3$, $TX^3 2\_4$, $TX^4 1\_3$, and $TX^4 2\_4$ denote transfer control lines. Reference characters RES1, RES2, and RES3 denote reset control lines. Reference characters SEL1, SEL2, and SEL3 denote select control lines. These lines are formed as the first wiring layer ML1 (see FIG. 3).

The transfer control lines $TX^1 1\_3$ to $TX^4 2\_4$ extend between pixel units adjacent to each other in the vertical direction and are configured to supply a common control signal to the gates of transfer transistors adjacent to each other in the vertical direction. Also, the transfer control lines $TX^1 1\_3$ to $TX^4 2\_4$ are configured to supply a common control signal to the gates of corresponding transfer transistors in pixel units adjacent to each other in the horizontal direction.

The reset control lines RES1 to RES3 extend between pixel units adjacent to each other in the vertical direction and are configured to supply a common control signal to the gates of the reset transistors corresponding to photoelectric conversion units adjacent to each other in the vertical direction. Also, the reset control lines RES1 to RES3 are configured to supply a common control signal to the gates of corresponding reset transistors in pixel units adjacent to each other in the horizontal direction.

The select control lines SEL1 to SEL3 extend between pixel units adjacent to each other in the vertical direction and are configured to supply a common control signal to the gates of the select transistors corresponding to photoelectric conversion units adjacent to each other in the vertical direction. Also, the select control lines SEL1 to SEL3 are configured to supply a common control signal to the gates of corresponding select transistors in pixel units adjacent to each other in the horizontal direction.

In this way, the lines in the first wiring layer ML1 are shared, reducing the number of lines in the first wiring layer ML1.

Next, lines extending in the vertical direction among the multiple photoelectric conversion units in the pixel unit array 10 toward the readout unit 30 will be described with reference to FIG. 1.

Reference numerals 102-1, 102-2, and 102-3 denote vertical power supply lines. Reference numerals 103-1, 103-2, and 103-3 denote vertical signal lines. The vertical power supply lines 102-1 to 102-3 and vertical signal lines 103-1 to 103-3 are arranged alternately in the horizontal direction. These lines are formed as the second wiring layer ML2 (see FIG. 3).

Each of the vertical power supply lines 102-1 to 102-3 extends in the vertical direction between 2 pixel units adjacent to each other in the horizontal direction to supply power to an amplification transistor or reset transistor of the pixel unit. Each of the vertical power supply lines 102-1 to 102-3 supplies power supply voltage to the reset transistor in the pixel unit on a first side (left side in FIG. 1) and supplies the power supply voltage to the amplification transistor in the pixel unit on a second side (right side in FIG. 1). That is, each of the vertical power supply lines 102-1 to 102-3 are configured to supply common power supply voltage to the reset transistor placed on the first side and the amplification transistor placed on the second side. Consequently, in the pixel unit, the power supply voltage is supplied to the amplification transistor from a first vertical power supply line extending between the given pixel unit and the adjacent pixel unit on the first side in the horizontal direction. Also, in the pixel unit, the power supply voltage is supplied to the reset transistor from a second vertical power supply line extending between the given pixel unit and the adjacent pixel unit on the second side in the horizontal direction.

Each of the vertical signal lines 103-1 to 103-3 extends in the vertical direction among multiple photoelectric conversion units in the pixel unit to transfer a signal output from the amplification transistor of the pixel unit. Each of the vertical signal lines 103-1 to 103-3 serves as a common signal line for the multiple photoelectric conversion units in the pixel unit as well as for the pixel units arranged in the vertical direction in the pixel unit array.

In this way, the lines in the second wiring layer ML2 are shared and arranged evenly (at equal intervals), reducing the number of lines in the second wiring layer ML2. That is, in the multilayer wiring structure MWS, the number of lines in the second wiring layer ML2 which is the uppermost wiring layer in the image sensing region IA (see FIG. 3) is reduced. This makes it possible to widen the aperture region (e.g., the aperture region OA shown in FIG. 5) of the photoelectric conversion unit and thereby reduce diffraction of light by the wiring which defines the aperture region. This in turn makes it possible to reduce optical mixture of colors resulting from the diffraction of light by the wiring which defines the aperture region.

Figure 2:
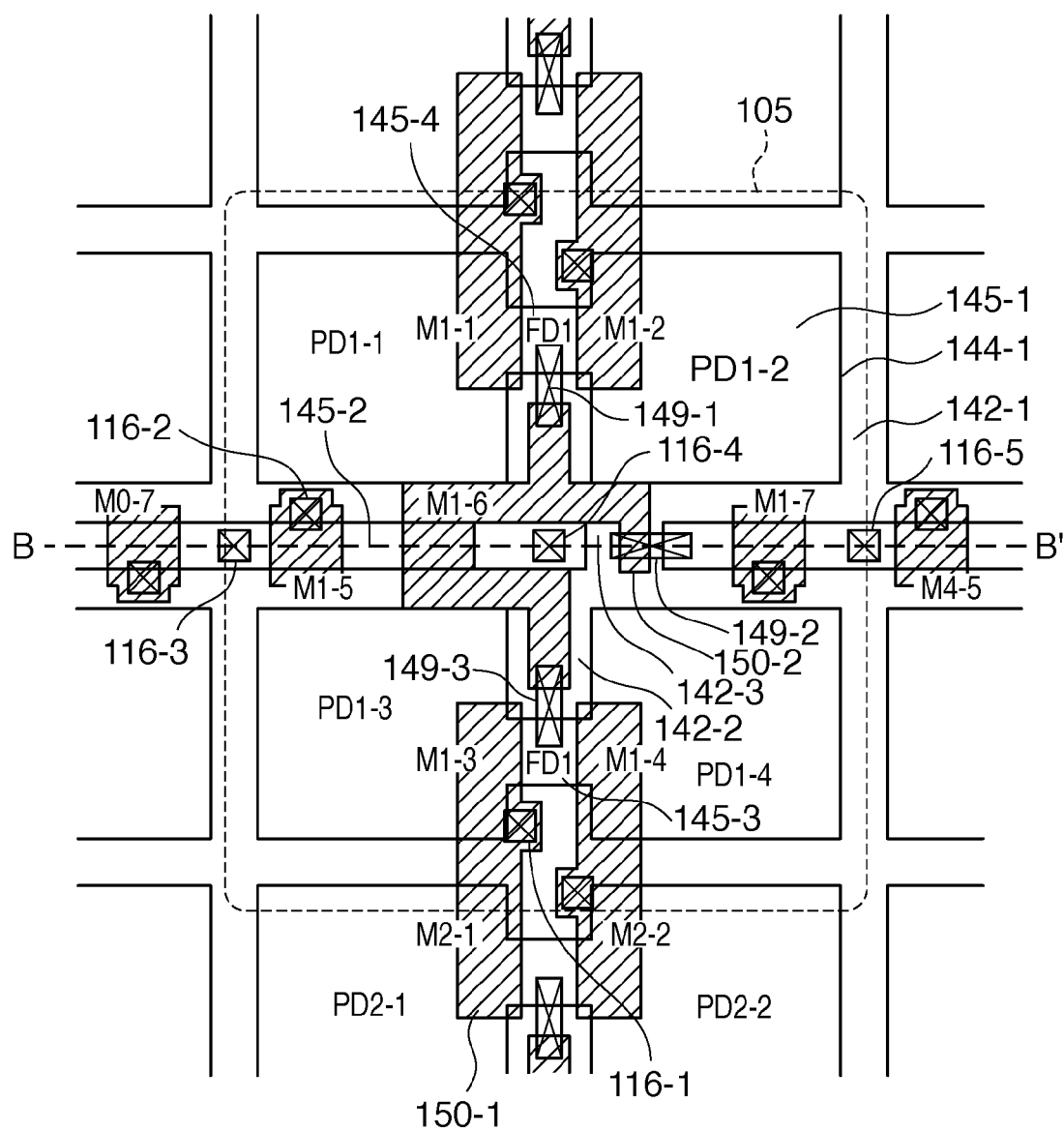
FIG. 2 is a plan view of a pixel unit PU12 and its surroundings when viewed with a second wiring layer ML2, through-hole plugs 115, and a first wiring layer ML1 (see FIG. 3) removed.

Next, a layout configuration of the pixel unit PU12 and its surroundings will be described with reference to FIG. 2. FIG. 2 is a plan view of the pixel unit PU12 and its surroundings when viewed with the second wiring layer ML2, through-hole plugs 115, and the first wiring layer ML1 (see FIG. 3) removed.

In FIG. 2, reference numerals 149-1, 149-2, and 149-3 denote shared contact plugs. Reference numerals 150-1 and 150-2 denote polycrystalline silicon regions. Reference numerals 116-1, 116-2, 116-3, 116-4, and 116-5 denote contact plugs. Reference numeral 144-1 denotes a boundary between an active region and field oxide region. Reference numerals 142-1, 142-2, and 142-3 denote field oxide regions. Reference numerals 145-1, 145-2, 145-3, and 145-4 denote active regions.

The photoelectric conversion units PD1-1 to PD1-4 are formed in the active region 145-1. MOS transistors (e.g., the select transistor M1-5, amplification transistor M1-6, and reset transistor M1-7) are formed in the active region 145-2. The charge-voltage converter FD1 is formed in the active region 145-3. The charge-voltage converter FD1 is formed as a semiconductor region containing impurities. The field oxide regions 142 (142-1 to 142-3) are arranged so as to isolate components in the active regions 145 (145-1 to 145-4). For example, the active region 145-1 including the photoelectric conversion unit PD1-2 is located on the left side of the boundary 144-1 between an active region and field oxide region. The field oxide region 142-1 is located on the right side of the boundary 144-1.

Next, a cross-sectional configuration of the pixel unit PU12 and its surroundings will be described with reference to FIG. 3. FIG. 3 is a sectional view taken along line B-B' in the plan view of FIG. 2.

In FIG. 3, hatched area 118 represents a p-type region while hatched area 119 represents an n-type region. Reference numerals 143-1 and 143-2 denote source regions; 145-2 denotes a region which combines a drain region and source region; 147 and 148 denote common drain regions; 113-7, 113-8, and 113-9 denotes patterns in the first wiring layer; and 115-1, 115-2 and 115-3 denote through-hole plugs. The other reference numerals are the similar to those in FIGS. 1 and 2.

The contact plug 116-3 electrically connects the pattern 113-7 in the first wiring layer with the common drain region 147 of a reset transistor M0-7 (see FIG. 1) and the select transistor M1-5.

The contact plug 116-4 electrically connects the pattern 113-8 in the first wiring layer with the source region 143-1 of the amplification transistor M1-6.

The contact plug 116-5 electrically connects the pattern 113-9 in the first wiring layer with the common drain region 148 of the reset transistor M1-7 and a select transistor M4-5.

The through-hole plug 115-1 electrically connects the pattern 113-7 in the first wiring layer with the vertical power supply line 102-2 made up of lines in the second wiring layer. The through-hole plug 115-2 electrically connects the pattern 113-8 in the first wiring layer with the vertical signal line 103-2 made up of lines in the second wiring layer. The through-hole plug 115-3 electrically connects the pattern 113-9 in the first wiring layer with the vertical power supply line 102-3 made up of lines in the second wiring layer.

That is, as shown in FIGS. 2 and 3, a channel length direction of the amplification transistor, reset transistor, and select transistor runs orthogonally to the direction in which the vertical signal line and vertical power supply line extend, meaning that the channel length direction corresponds to the horizontal direction. Consequently, the power supply voltage Vdd is supplied to the common drain regions 147 and 148 via separate vertical power supply lines 102-2 and 102-3, respectively. The power supply voltage Vdd can be 1 to 5 V, or can be 2.5 to 3.3 V.

As a result of the arrangement described above, the source region 143-1 of the amplification transistor M1-6 is placed just below an approximate midpoint between the vertical power supply line 102-2 and vertical power supply line 102-3. Consequently, as shown in the sectional view in FIG. 3, the vertical signal line 103-2 installed in the second wiring layer and connected to the source region 143-1 via the contact plug 116-4, patterns 113-8 in the first wiring layer, and through-hole plug 115-2 can be placed at a pixel boundary 137-2. This allows layout to be done such that only a single line in the vertical direction will be used per column of pixels and that the vertical power supply lines and vertical signal lines in the second wiring layer will be arranged at equal intervals. This has a great effect on shrunken pixels in which diffraction of light can occur as described later.

As shown in the sectional view in FIG. 3, the shared contact plug 149-2 electrically connects the source region 143-2 of the reset transistor M1-7 to the polycrystalline silicon region 150-2. As shown in the plan view of FIG. 2, the polycrystalline silicon region 150-2 is electrically connected to a gate electrode of the amplification transistor M1-6 via polycrystalline silicon wiring, the gate electrode being a polycrystalline silicon region.

The shared contact plug 149-1 electrically connects the polycrystalline silicon region 150-2 and the charge-voltage converter FD1 with each other.

The polycrystalline silicon region 150-1 is configured to be a gate electrode of the transfer transistor M1-3 and is connected with a line 113-5 (see FIGS. 2 and 4) in the first wiring layer via the contact plug 116-1.

In the present embodiment, electrically connected charge-voltage converters (floating diffusion) are considered to be a single charge-voltage converter. That is, in FIG. 2, the active region 145-3 and active region 145-4, which are connected via the shared contact plug 149-3, polycrystalline silicon region 142-3, and shared contact plug 149-1, are regarded to be a single charge-voltage converter FD1.

Figure 4:
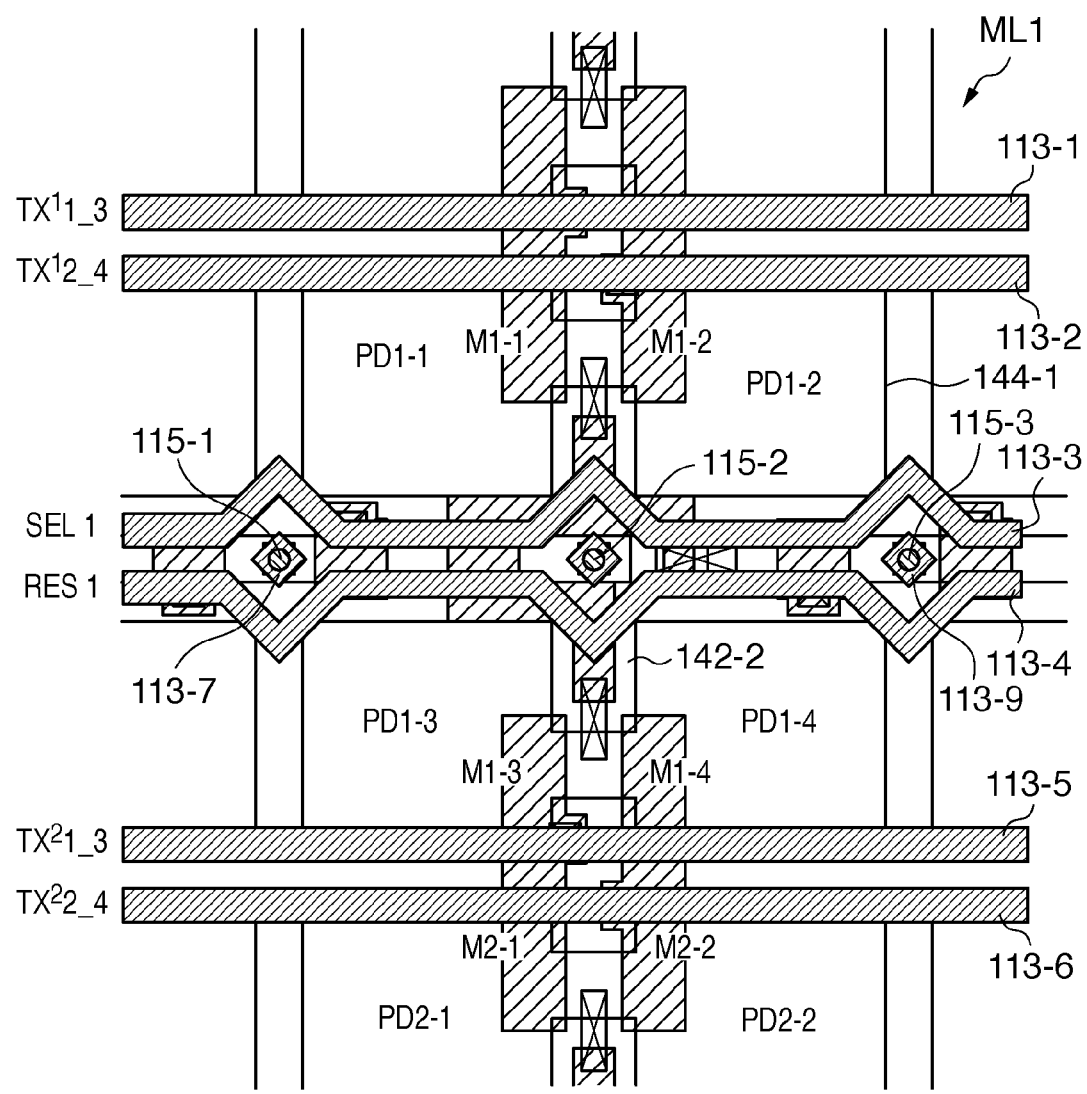
FIG. 4 is a plan view obtained by further placing the through-hole plugs 115 and first wiring layer ML1 on the plan view of FIG. 2.

FIG. 4 is a plan view obtained by further placing the through-hole plugs 115 (115-1 to 115-3 shown in FIG. 3) and first wiring layer ML1 on the plan view of FIG. 2.

In FIG. 4, the transfer control lines $TX^2 1\_3$, $TX^2 2\_4$, $TX^2 1\_3$, $TX^2 2\_4$ are made of lines 113-1, 113-2, 113-5, 113-6 in the first wiring layer ML1, respectively.

The select control line SEL1 and reset control line RES1 are made of lines 113-3 and 113-4 in the first wiring layer ML1, respectively.

Island patterns 113-7, 113-8, and 113-9 of the first wiring layer ML1 are located under the through-hole plugs 115-1, 115-2, and 115-3.

Next, charges transfer in the pixel unit will be described by focusing on the photoelectric conversion unit PD1-3.

Quantity of charges accumulated in the photoelectric conversion unit PD1-3 increases with an amount of light to which a light receiving surface of the photoelectric conversion unit PD1-3 is exposed. The transfer transistor M1-3 turns on when an active control signal (pulse) is input in its gate via the transfer control line $TX^2 1\_3$. Consequently, the charges accumulated in the photoelectric conversion unit PD1-3 have been completely transferred to the charge-voltage converter FD1. The charge-voltage converter FD1 has parasitic capacitance, and thus the potential of the charge-voltage converter FD1 changes with the quantity of charges transferred from the photoelectric conversion unit PD1-3.

Figure 5:
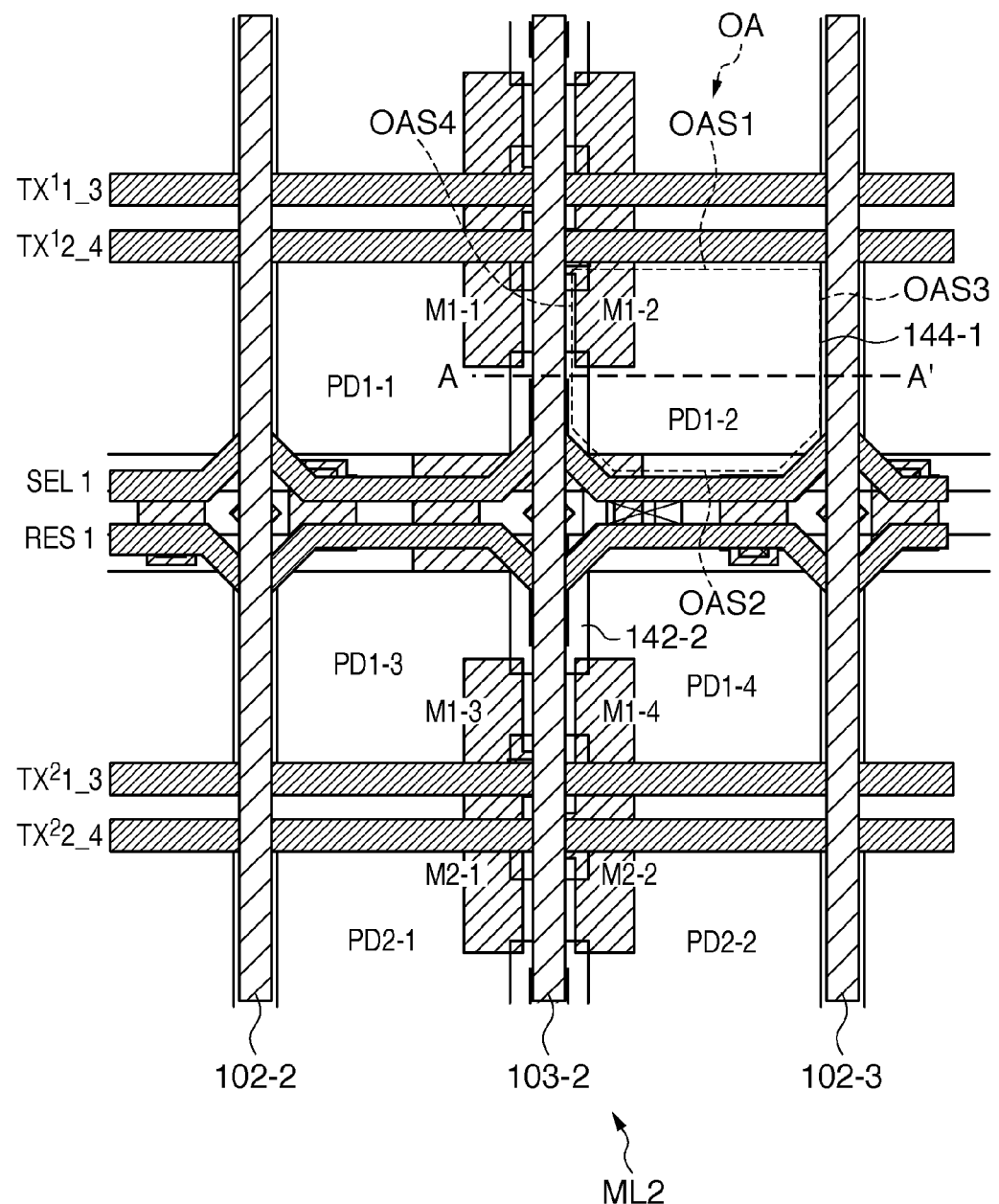
FIG. 5 is a plan view obtained by further placing the second wiring layer ML2 on the plan view of FIG. 4.

FIG. 5 is a plan view obtained by further placing the second wiring layer ML2 on the plan view of FIG. 4.

In FIG. 5, the vertical power supply line 102-2, vertical signal line 103-2, and vertical power supply line 102-3 are lines located in the second wiring layer ML2.

The vertical power supply line 102-2 is placed on the left of the photoelectric conversion units PD1-1, PD1-3, and PD2-1. The vertical power supply line 102-3 is placed on the right of the photoelectric conversion units PD1-2, PD1-4, and PD2-2. Also, the vertical signal line 103-2 is placed on the right of the photoelectric conversion units PD1-1, PD1-3, and PD2-1, but on the left of the photoelectric conversion units PD1-2, PD1-4, and PD2-2, i.e., between the two groups.

According to the present embodiment, the image sensing device is, for example, a single-plate color CMOS area sensor. Thus, color filters are placed on the upper layer of lines in the second wiring layer. Now, the color filters will be described.

Figure 6:
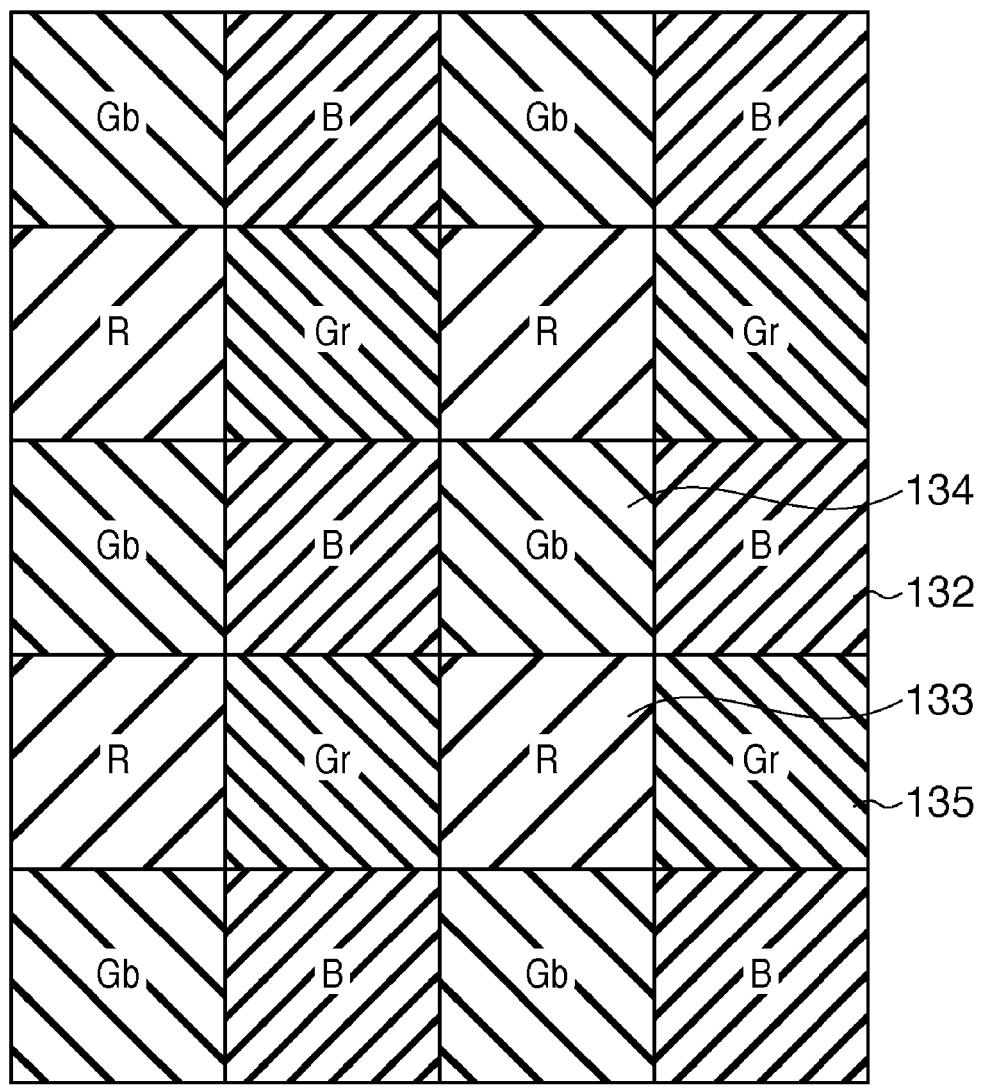
FIG. 6 is a plan view obtained by putting color filters on the plan view of FIG. 5.

FIG. 6 is a plan view obtained by putting color filters on the plan view of FIG. 5.

In FIG. 6, reference numeral 132 denotes a color filter which selectively transmits blue (B) light. Reference numeral 133 denotes a color filter which selectively transmits red (R) light. Reference numerals 134 and 135 denote color filters which selectively transmit green (Gr, Gb) light.

As shown in FIG. 6, the color filters are arranged in a Bayer array. The Bayer array, which serves to increase resolution of a color image, is used in most single-plate area sensors. The pixel in which the green color filter 134 is installed is referred to as a Gb pixel in the sense that the pixel is located adjacent to a blue (B) pixel in the horizontal direction. On the other hand, the pixel in which the green color filter 135 is installed is referred to as a Gr pixel in the sense that the pixel is located adjacent to a red (R) pixel in the horizontal direction.

As shown in the equivalent circuit diagram in FIG. 1 and the plan views of an image sensing region in FIGS. 2, 4, and 5, the pixel array according to the present embodiment is made up of pixel units each of which has an identical 2 by 2 pixel pattern containing 4 pixels. As shown in FIG. 6, the Bayer array also has a 2 by 2 pixel pattern containing 4 pixels, and thus the pixel array according to the present embodiment is suitable for the Bayer array. Each pixel unit in the pixel unit array further includes multiple color filters corresponding to the multiple photoelectric conversion units. Each color filter selectively transmits light of predetermined color (wavelength) so that the light of the predetermined color (wavelength) will enter the photoelectric conversion unit.

Specifically, the pixels covered with the blue color filter 132 are laid out in the same manner, that is, occupy the same relative position in the pixel units over the entire image sensing region. The pixels covered with the red color filter 133 are always laid out in the same manner in the entire image sensing region. Also, the Gb pixels are always laid out in the same manner in the entire image sensing region and the Gr pixels are always laid out in the same manner in the entire image sensing region. This prevents sensitivity differences among adjacent pixels of the same color.

According to the present embodiment, the optical mixture of colors is defined to be mixture of lights among adjacent pixels. The present embodiment, which can prevent mixture of lights among adjacent pixels when applied even to monochrome area sensors, three-plate area sensors, or other area sensors, has the advantage of increasing real resolution of sensors.

Figure 7:
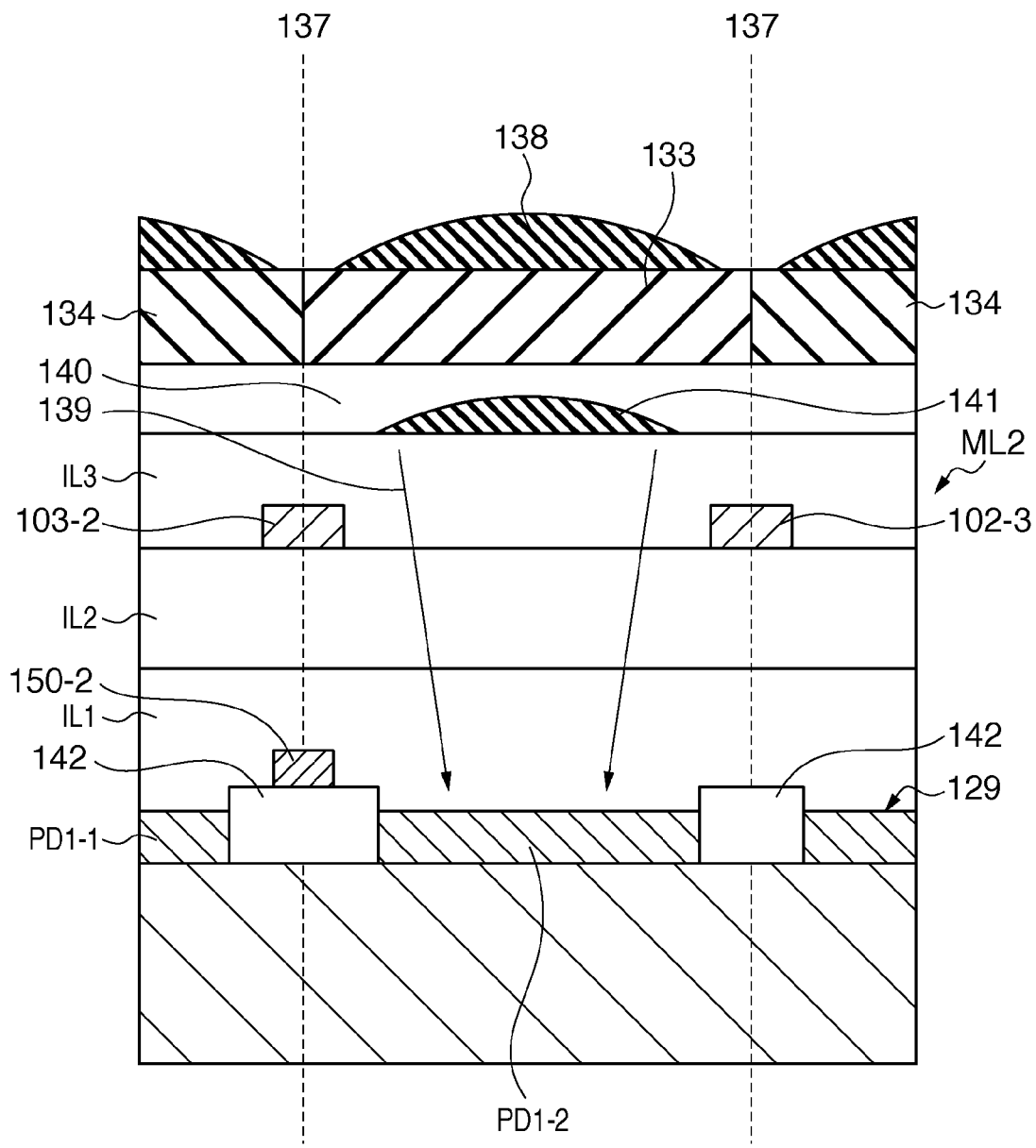
FIG. 7 is a sectional view taken along line A-A' in the plan view of FIG. 5.

FIG. 7 is a sectional view taken along line A-A' in the plan view of FIG. 5.

In FIG. 7, reference numeral 129 denotes a boundary between a silicon substrate and interlayer insulating film, 137 denotes a pixel boundary, 138 denotes an on-chip microlens, 139 denotes a luminous flux, 140 denotes a planarizing resin layer, and 141 denotes an interlayer lens. The other reference numerals are the similar to those in FIGS. 1 to 6.

Only one vertical power supply line 102-3 is installed on the right side in an area above the photoelectric conversion unit PD1-2, as a line in the second wiring layer ML2. Only one vertical signal line 103-2 is installed on the left side in an area above the photoelectric conversion unit PD1-2, as a line in the second wiring layer ML2. That is, in the entire image sensing device, one line of the second wiring layer is installed per pixel column. Consequently, compared to conventional structure of the second wiring layer containing 1.5 or more lines per pixel column, structure of the second wiring layer ML2 according to the present embodiment containing 1 or more lines per pixel column curbs spreading of the luminous flux 139 due to diffraction, and thereby reduces the optical mixture of colors.

Also, according to the first embodiment, when the pixel is seen through in the direction of a normal to the light-receiving surface of the photoelectric conversion unit, the lines 102-2, 103-2, 102-3 in the second wiring layer ML2 jut out to the light-receiving surface of photoelectric conversion unit less than in the case of conventional. Thus, the first embodiment can reduce vignetting of light which has failed to be gathered completely due to the diffraction limit of the on-chip microlens 138 or interlayer lens 141. This increases sensitivity.

As shown in the sectional view of FIGS. 3 and 7 and the plan view of FIG. 5, the vertical power supply line 102-3 on the right of the column of the photoelectric conversion unit PD1-2 and the vertical signal line 103-2 on the left are placed at the pixel boundary 137. Also, as shown in the plan view of FIG. 5, the vertical power supply line 102-2 on the left of the column of the photoelectric conversion unit PD1-1 is placed at the pixel boundary. This configuration makes it possible to achieve balance between the column of the photoelectric conversion unit PD1-1 and the column of the photoelectric conversion unit PD1-2 and thus easy to equalize amounts of light incident on the photodiodes of the two pixels.

Also, according to the first embodiment, as shown in the sectional view of FIGS. 3 and 7, the image sensing region IA has only two wiring layers: the first wiring layer ML1 including the line 113, and the second wiring layer ML2 including the vertical power supply lines 102-2 and 102-3 and vertical signal line 103-2. That is, the only wiring layers in the image sensing region IA are the first wiring layer ML1 and second wiring layer ML2. This structure is suitable for reducing diffraction of light in shrunken pixels.

A driving method for the image sensing device according to the first embodiment will be described with reference to FIG. 8 showing an equivalent circuit diagram of a peripheral region and FIG. 1 showing an equivalent circuit diagram of a vertical scanning circuit and image sensing region.

In the readout unit 30 shown in FIG. 8, reference numeral 111 denotes a load current supply, 122 denotes a luminance-level horizontal signal line, 121 denotes a noise-level horizontal signal line, 123 denotes an output amplifier, 124 denotes a horizontal scanning circuit, and 125 denotes an external signal terminal. Reference numerals 151, 152, 153, and 154 denote signal sampling lines and reference characters φPIN_A, φPTS_A, φPIN_B, and φPTS_B denote voltage pulses of the respective signal sampling lines.

Reference characters M11 to M14 denote sampling transistors, and M15 to M18 denote horizontal output transistors. Also, reference characters CTNA and CTNB denote noise-level holding capacitances, and CTSA and CTSB denote luminance-level holding capacitances. Reference numerals 155 to 160 denote control lines of the horizontal scanning circuit 124.

Figure 9:
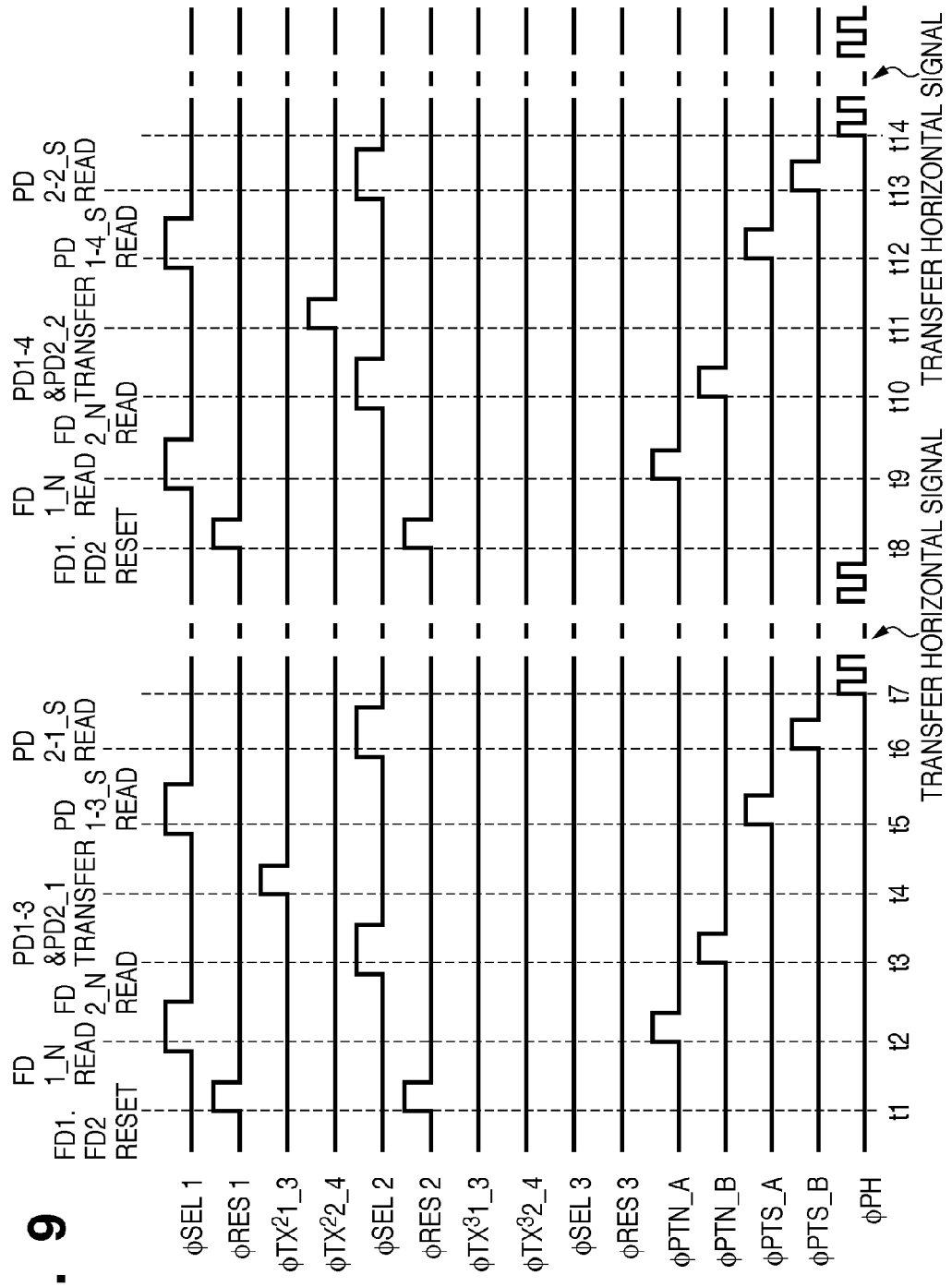
FIG. 9 is a timing chart showing a driving method for the image sensing device 100 according to the first embodiment.

Timing will be described with reference to a timing chart in FIG. 9. FIG. 9 is a timing chart showing a driving method for the image sensing device according to the first embodiment. Control signals supplied from the vertical scanning circuit 107 to the pixel unit array 10 or readout unit 30 will be described below.

First, at time t1, φRES1 and φRES2 (see FIG. 1) are set active. Consequently, in the pixel units PU11 to PU13 in the first row and pixel units PU21 to PU23 in the second row, the reset transistors turn on, and at the same time, charge-voltage converters are reset to the power supply voltage Vdd.

Next, at time t2, pulses φSEL1 and φPTN_A are set active. Consequently, the pixel units PU11 to PU13 in the first row enter a selected state and output a noise-level signal to the vertical signal lines 103-1 to 103-3. Since the sampling transistor M11 turns on, the noise-level signals output from respective columns to the vertical signal lines 103-1 to 103-3 are written into the noise-level holding capacitances CTNA of the respective columns.

Next, at time t3, φSEL2 and φPTN_B are set active. Consequently, the pixel units PU21 to PU23 in the second row enter a selected state and output a noise-level signal to the vertical signal lines 103-1 to 103-3. Since the sampling transistor M13 turns on, the noise-level signals output from respective columns to the vertical signal lines 103-1 to 103-3 are written into the noise-level holding capacitances CTNB of the respective columns.

Next, at time t4, φTX$^2$1_3 is set active. The charges accumulated in the photoelectric conversion unit PD1-3 by exposure to light are transferred to the charge-voltage converter FD1. At the same time, the charges accumulated in the photoelectric conversion unit PD2-1 by exposure to light are transferred to the charge-voltage converter FD2.

Next, at time t5, φSEL1 and φPTS_A are set active. Consequently, the pixel units PU11 to PU13 in the first row enter a selected state and output a luminance-level signal to the vertical signal lines 103-1 to 103-3. Since the sampling transistor M12 turns on, the luminance-level signals output from respective columns to the vertical signal lines 103-1 to 103-3 are written into the luminance-level holding capacitances CTSA of the respective columns.

Next, at time t6, φSEL2 and φPTN_B are set active. Consequently, the pixel units PU21 to PU23 in the second row enter a selected state and output a luminance-level signal to the vertical signal lines 103-1 to 103-3. Since the sampling transistor M14 turns on, the luminance-level signals output from respective columns to the vertical signal lines 103-1 to 103-3 are written into the luminance-level holding capacitances CTSB of the respective columns.

Next, at time t7 and later, the horizontal scanning circuit 124 sends control pulses to its control lines 155 to 160 in sequence from left to right, and the horizontal output transistors M15 to M18 turn on in sequence. However, M15 and M16 turn on simultaneously, and so do M17 and M18.

At the time when M15 and M16 turn on, the noise-level written into the noise-level holding capacitance CTNA and the luminance-level written into the luminance-level holding capacitance CTSA are output to the noise-level horizontal signal line 121 and luminance-level horizontal signal line 122, respectively.

At the time when M17 and M18 turn on, the noise-level written into the noise-level holding capacitance CTNB and the luminance-level written into the luminance-level holding capacitance CTSB are output to the noise-level horizontal signal line 121 and luminance-level horizontal signal line 122, respectively.

The output amplifier 123 subtracts the noise-level received via the noise-level horizontal signal line 121 from the luminance-level received via the luminance-level horizontal signal line 122, and thereby generates and outputs an image signal from the external signal terminal 125.

In this way, half the pixels in the column containing the photoelectric conversion unit PD1-3 and the column containing the photoelectric conversion unit PD2-1 are scanned. That is, in the pixel unit PU12 which shares 4 pixels, scanning of the left half of the photoelectric conversion units (pixels) is completed.

Operation at times t8 to time t10 is the similar to operation at times t1 to t3.

At time t11, φTX²2_4 is set active. The charges accumulated in the photoelectric conversion unit PD1-4 by exposure to light are transferred to the charge-voltage converter FD1. At the same time, the charges accumulated in the photoelectric conversion unit PD2-2 by exposure to light are transferred to the charge-voltage converter FD2.

Operation at times t12 to t14 is the similar to operation at times t5 to t7.

In this way, the remaining half of the pixels in the column containing the photoelectric conversion unit PD1-3 and the column containing the photoelectric conversion unit PD2-1 are scanned. That is, in the pixel unit PU12 which shares 4 pixels, scanning of the right half of the photoelectric conversion units (pixels) is completed.

Figure 10:
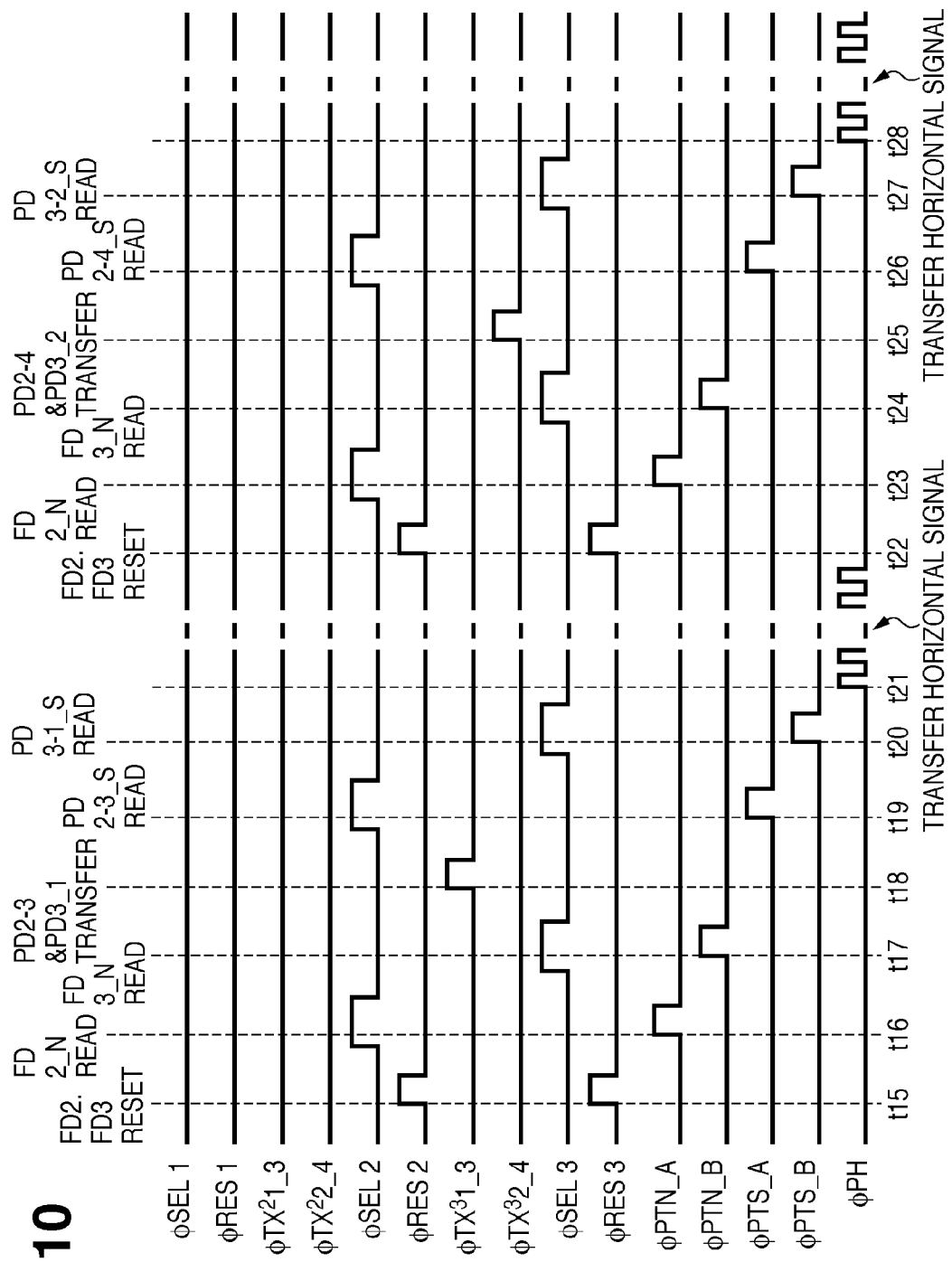
FIG. 10 is a timing chart showing a driving method for the image sensing device 100 according to the first embodiment.

Next, going to a timing chart in FIG. 10, the luminance levels of the photoelectric conversion units PD2-3, PD3-1, PD2-4, and PD3-1 are read out in the same manner as in the timing chart of FIG. 9. Operation at times t15 to t28 in FIG. 10 is the similar to operation at times t1 to t14 in FIG. 9.

Subsequently, as a result of similar scanning, image signals of all the pixels are output.

According to the present embodiment, the power supply voltage is supplied in the vertical direction via the vertical power supply lines 102-2 and 102-3, to keep a distance from the vertical signal line 103 and thereby reduce influence of cross-talk. This makes it possible to prevent voltage drops in the vertical power supply lines 102-2 and 102-3.

According to the present embodiment, as shown in FIG. 8, two noise-level holding capacitances CTNA and CTNB and two luminance-level holding capacitances CTSA and CTSB are connected to one vertical signal line 103-2 via the sampling transistors M11 to M14. That is, at least two noise-level holding capacitances and two luminance-level holding capacitances are placed per vertical signal line.

The present embodiment can widen the aperture region formed by the lines in the second wiring layer, and thereby reduce optical mixture of colors caused by diffraction of light. This makes it possible to generate an image signal which provides an image of clear image quality with high color reproducibility.

Also, this reduces the vignetting of light caused by wiring as the light cannot be gathered completely on the light-receiving surface of the photoelectric conversion units due to the diffraction limit of the on-chip microlens. Consequently, the sensitivity of the photoelectric conversion units can be increased.

Furthermore, since the image sensing region is made up of pixel units each of which has an identical 2 by 2 pixel pattern containing 4 pixels, sensitivity differences among adjacent pixels of the same color can be reduced.

It should be noted that, although it has been assumed in the above description that the transistors in the image sensing device are n-channel MOS transistors, the transistors in the image sensing device may be p-channel MOS transistors. In that case, however, the pulses given to the image sensing region are reversed in polarity.

Figure 11:
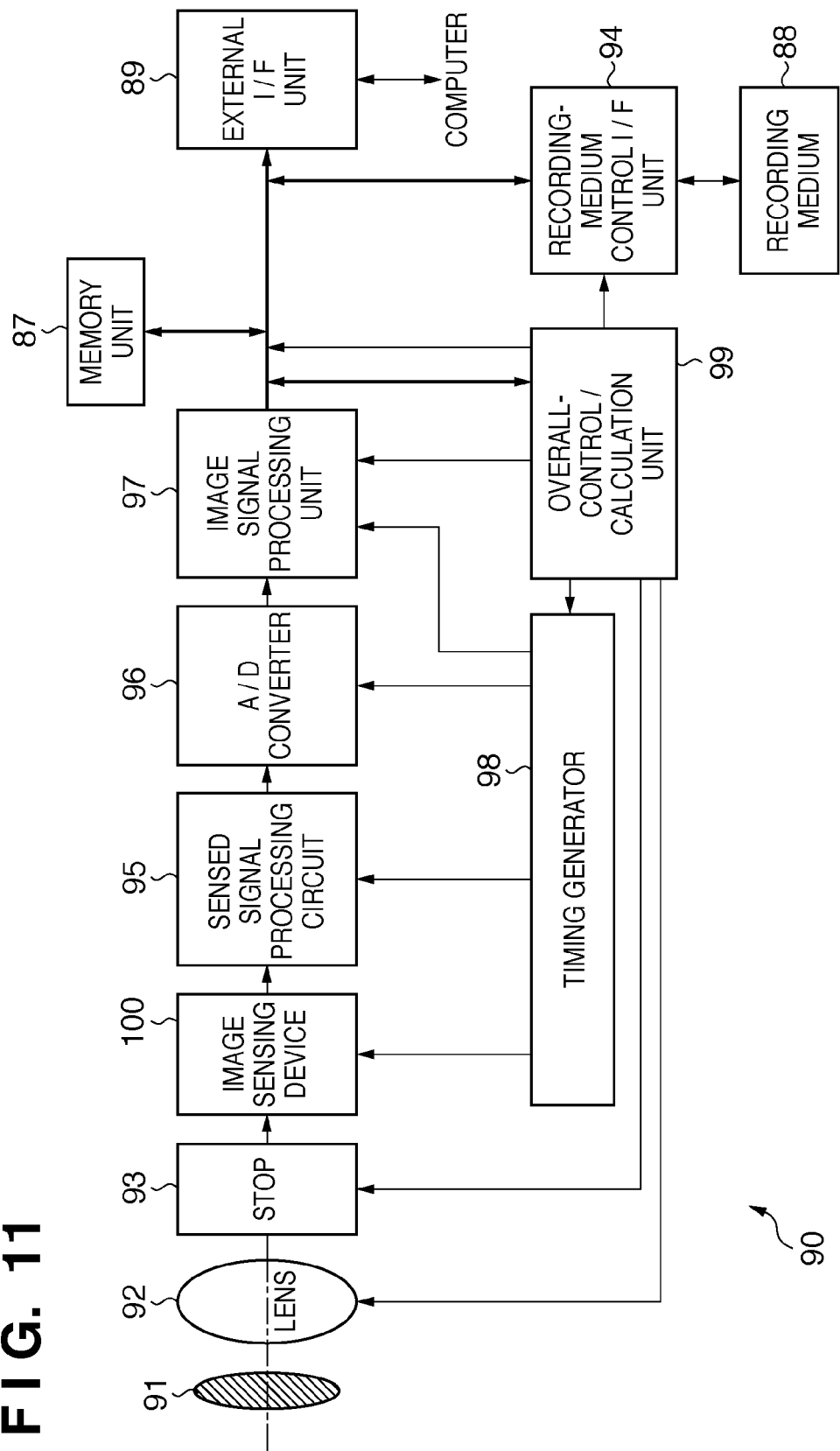
FIG. 11 is a block diagram of an image sensing system resulting from application of the image sensing device 100 according to the first embodiment.

An example of an image sensing system resulting from application of the image sensing device according to the present invention is shown in FIG. 11.

As shown in FIG. 11, the image sensing system 90 mainly includes an optical system, the image sensing device 100, and a signal processing unit. The optical system mainly includes a shutter 91, lens 92, and stop 93. The image sensing device 100 mainly includes the image sensing device 100. The signal processing unit mainly includes an sensed signal processing circuit 95, A/D converter 96, image signal processing unit 97, memory unit 87, external I/F unit 89, timing generator 98, overall-control/calculation unit 99, recording medium 88, and recording-medium control I/F unit 94. Incidentally, the signal processing unit does not always need to include a recording medium 88.

The shutter 91 controls exposure by being installed in front of the lens 92 on an optical path.

The lens 92 refracts incident light and forms an image of a subject on an image sensing surface of the image sensing device 100.

The stop 93 is installed between the lens 92 and image sensing device 100 on the optical path to adjust the amount of light led to the image sensing device 100 after passing through the lens 92.

The image sensing device 100 converts the image of the subject formed on the image sensing surface (image sensing region, pixel unit array) into an image signal. The image sensing device 100 reads the image signal out of the pixel unit array and outputs it.

The sensed signal processing circuit 95 is connected to the image sensing device 100 and processes the image signal output from the image sensing device 100.

The A/D converter 96 is connected to the sensed signal processing circuit 95 and converts the processed analog image signal output from the sensed signal processing circuit 95 into a digital image signal.

The image signal processing unit 97 is connected to the A/D converter 96 and generates image data by performing calculation processes such as various corrections on the image signal (digital signal) output from the A/D converter 96. The image data is supplied to the memory unit 87, external I/F unit 89, overall-control/calculation unit 99, recording-medium control I/F unit 94, and the like.

The memory unit 87 is connected to the image signal processing unit 97 and stores the image data output from the image signal processing unit 97.

The external I/F unit 89 is connected to the image signal processing unit 97. Consequently, the image data output from the image signal processing unit 97 is transferred to an external apparatus (such as a personal computer) via the external I/F unit 89.

The timing generator 98 is connected to the image sensing device 100, sensed signal processing circuit 95, A/D converter 96, and image signal processing unit 97 to supply a timing signal to the image sensing device 100, sensed signal processing circuit 95, A/D converter 96, and image signal processing unit 97. Consequently, the image sensing device 100, sensed signal processing circuit 95, A/D converter 96, and image signal processing unit 97 operate in synchronization with the timing signal.

The overall-control/calculation unit 99 is connected to the timing generator 98, image signal processing unit 97, and recording-medium control I/F unit 94 and generally controls the timing generator 98, image signal processing unit 97, and recording-medium control I/F unit 94.

The recording medium 88 is detachably connected to the recording-medium control I/F unit 94 to record the image data output from the image signal processing unit 97 on the recording medium 88 via the recording-medium control I/F unit 94.

The above configuration allows the image sensing device 100 to obtain a good image signal, making it possible to obtain a good image (image data).

Figure 13:
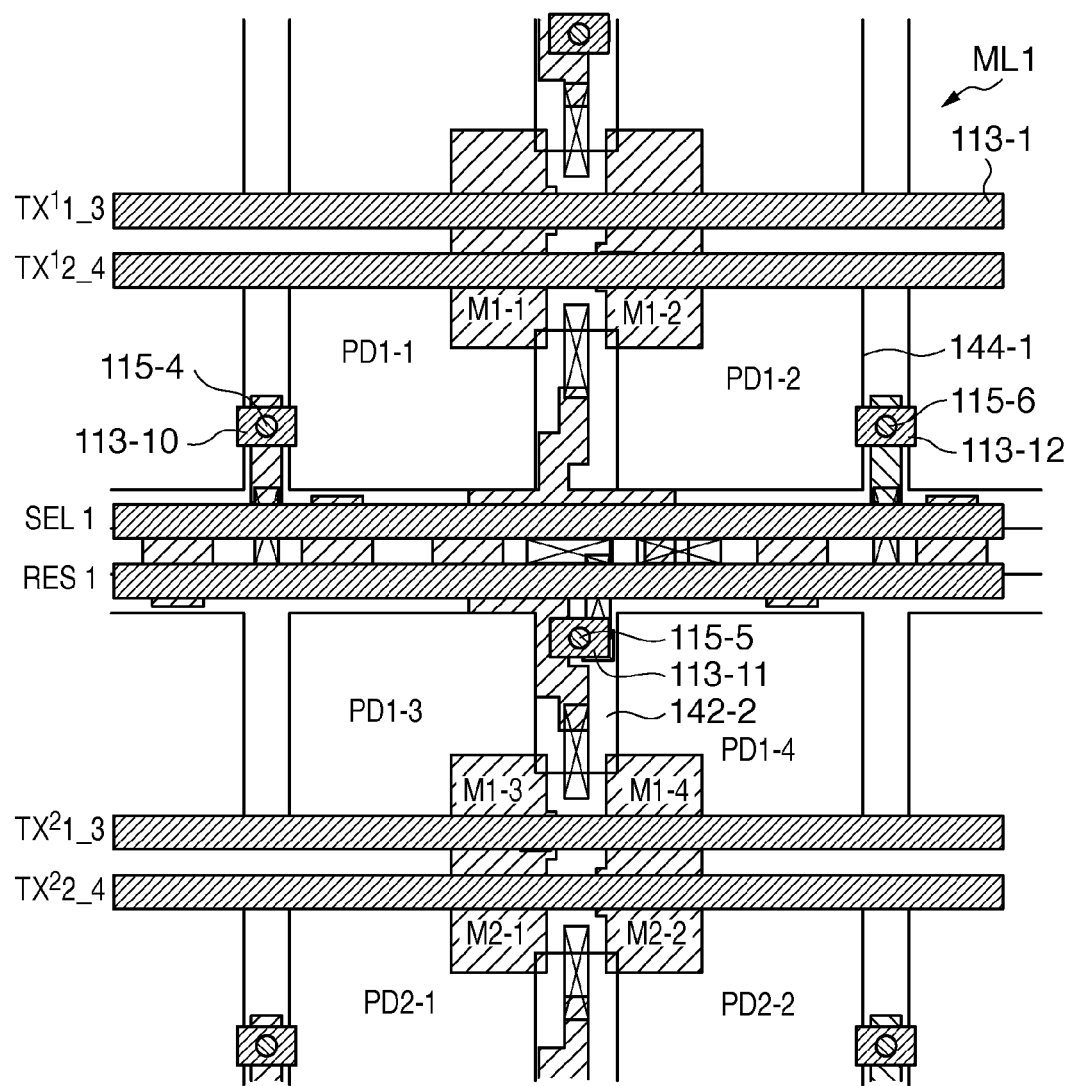
FIG. 13 is a plan view obtained by further placing the through-hole plugs 115 and first wiring layer ML1 on the plan view of FIG. 12.
Figure 14:
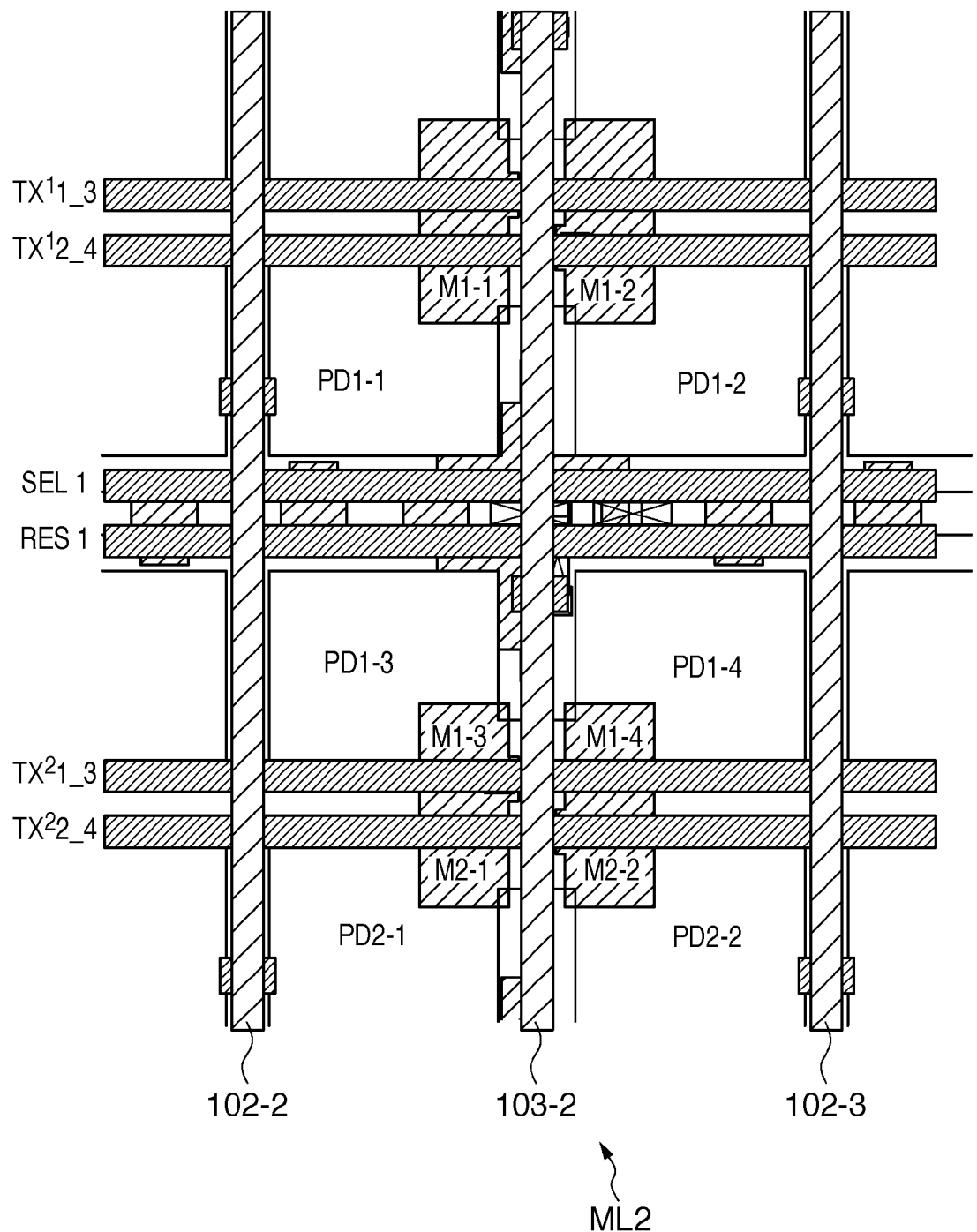
FIG. 14 is a plan view obtained by further placing the second wiring layer ML2 on the plan view of FIG. 13.

Next, an image sensing device 200 according to a second embodiment of the present invention will be described with reference to FIGS. 12 to 14. FIG. 12 is a plan view of a pixel unit PU12 according to the second embodiment of the present invention and its surroundings when viewed with the second wiring layer ML2, through-hole plugs 115, and first wiring layer ML1 (see FIG. 3) removed. FIG. 13 is a plan view obtained by further placing the through-hole plugs 115 and first wiring layer ML1 on the plan view of FIG. 12. FIG. 14 is a plan view obtained by further placing the second wiring layer ML2 on the plan view of FIG. 13. Differences from the first embodiment will mainly be described below.

The common drain region 147 is connected to the vertical power supply line 102-2 in the second wiring layer via the shared contact plug 149-3, a polycrystalline silicon region 150-3, a contact plug 116-6, a line 113-10 in the first wiring layer, and a through-hole plug 115-4.

The common drain region 148 is connected to the vertical power supply line 102-3 in the second wiring layer via a shared contact plug 149-5, polycrystalline silicon region 150-5, contact plug 116-7, line 113-12 in the first wiring layer, and through-hole plug 115-6.

The source region 143-1 of the amplification transistor M1-6 is connected to the vertical signal line 103-2 in the second wiring layer via a shared contact plug 149-4, contact plug 116-8, line 113-11 in the first wiring layer, and through-hole plug 115-5.

By extending the shared contact plug 149-4, the source region 143-1 of the amplification transistor M1-6 is connected with the vertical signal line 103-2 under the reset control line RES1 in a plane direction of the reset control line RES1. Also, the common drain region 147 is connected with the vertical power supply line 102-2 above the select control line SEL1 in a plane direction of the select control line SEL1 via the shared contact plug 149-3 and polycrystalline silicon region 150-3. Consequently, compared to the first embodiment (see FIG. 4), the select control line SEL1 and the reset control line RES1 can be placed linearly as shown in FIG. 13.

Thus, compared to the first embodiment, the second embodiment can improve an aperture ratio as well as symmetry of aperture shape. This makes it possible to improve sensitivity of the image sensing device, reduce F value dependence of the light incident upon the image sensing device, and prevent reduction in the amount of light around pixels.

Figure 15:
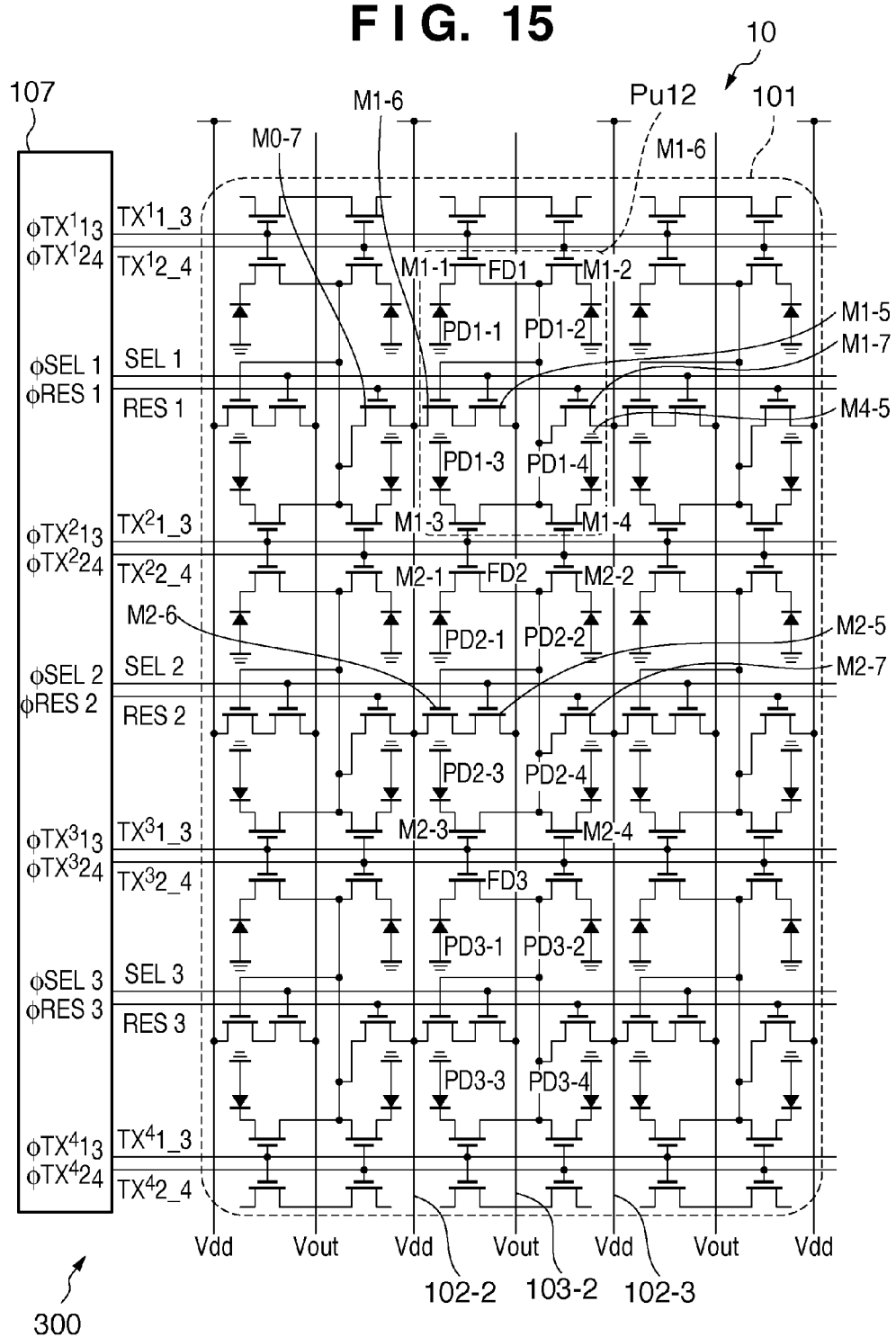
FIG. 15 is a diagram showing a circuit configuration of an image sensing device 300 according to a third embodiment of the present invention.
Figure 16:
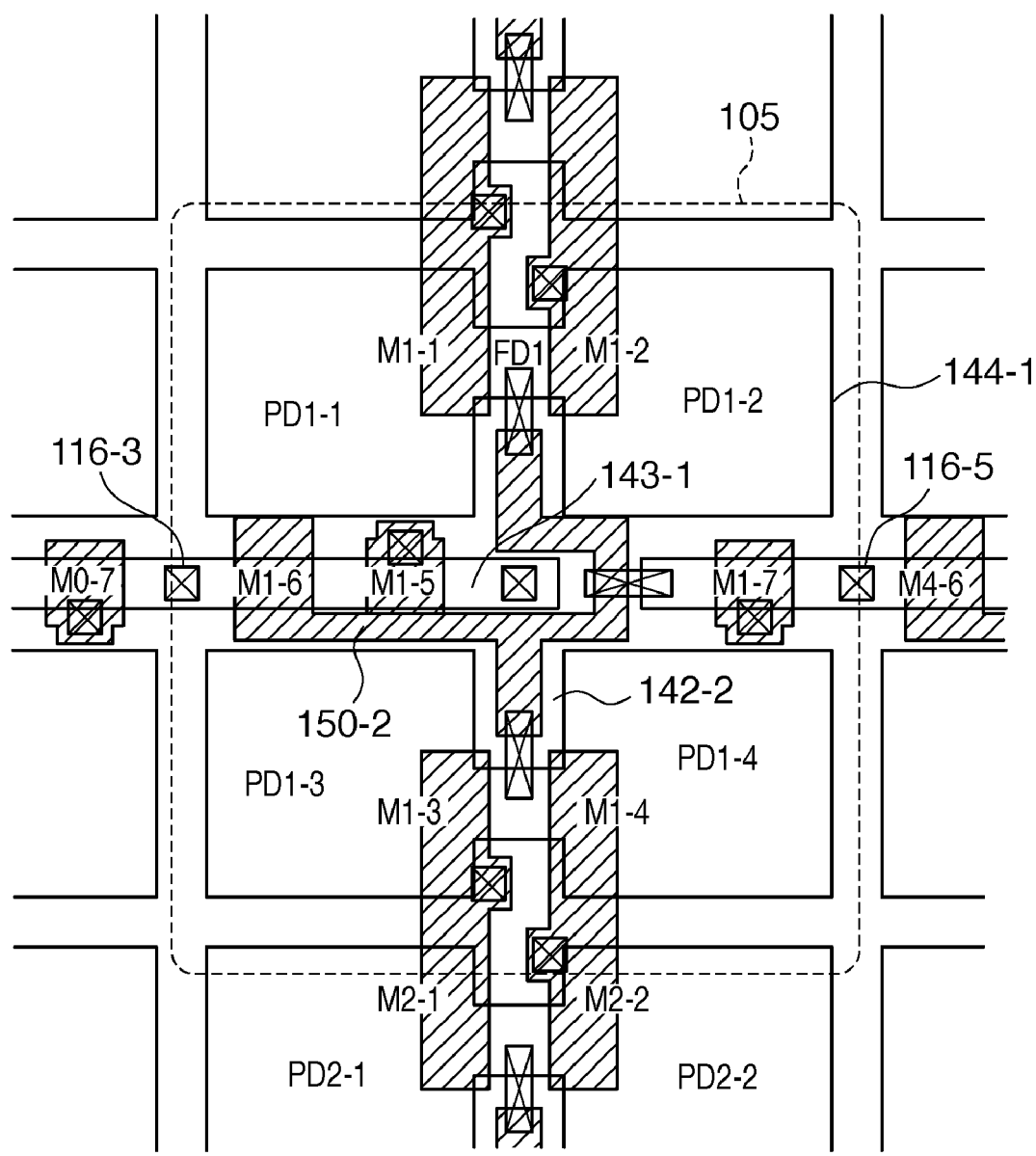
FIG. 16 is a plan view of a pixel unit PU12 and its surroundings when viewed with a second wiring layer ML2, through-hole plugs 115, and a first wiring layer ML1 (see FIG. 3) removed.
Figure 17:
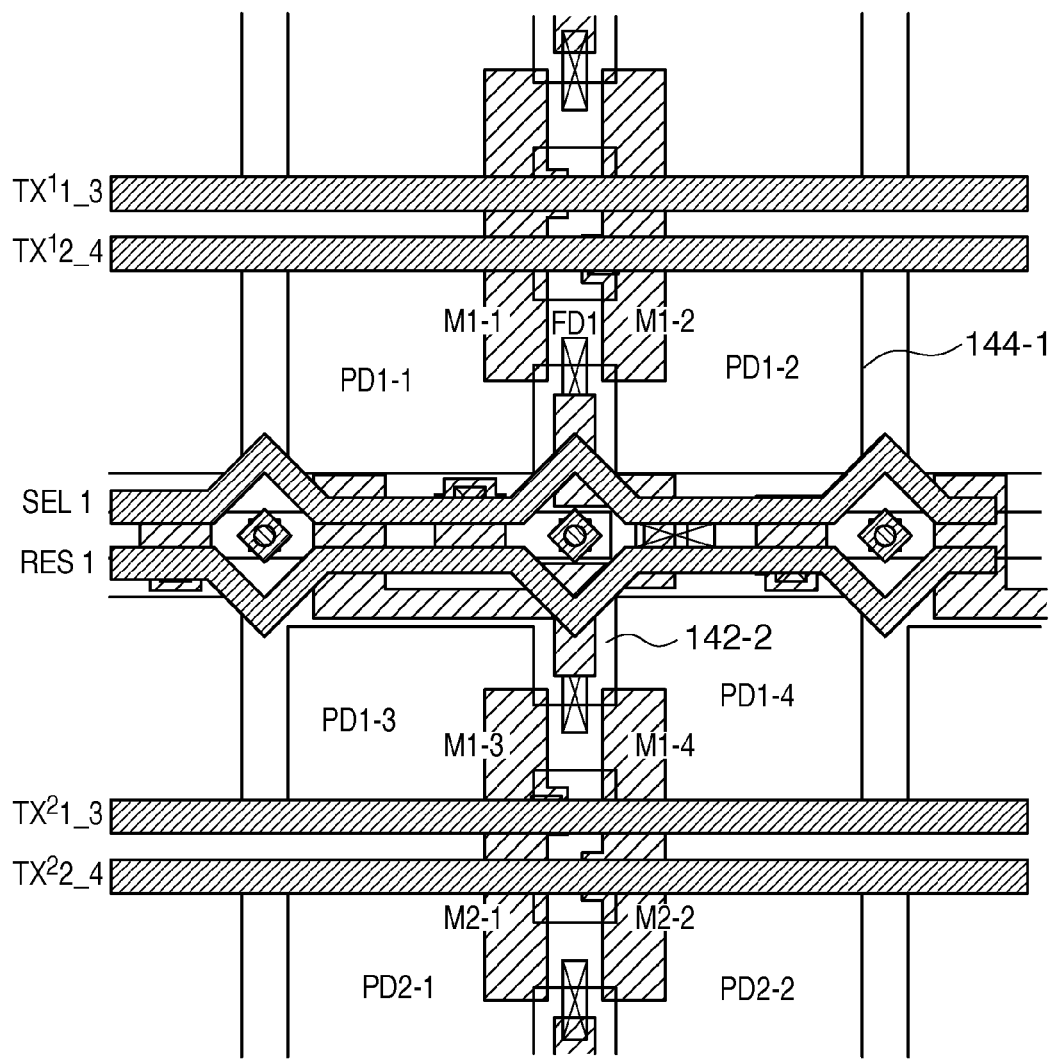
FIG. 17 is a plan view obtained by further placing the through-hole plugs 115 and first wiring layer ML1 on the plan view of FIG. 16.
Figure 18:
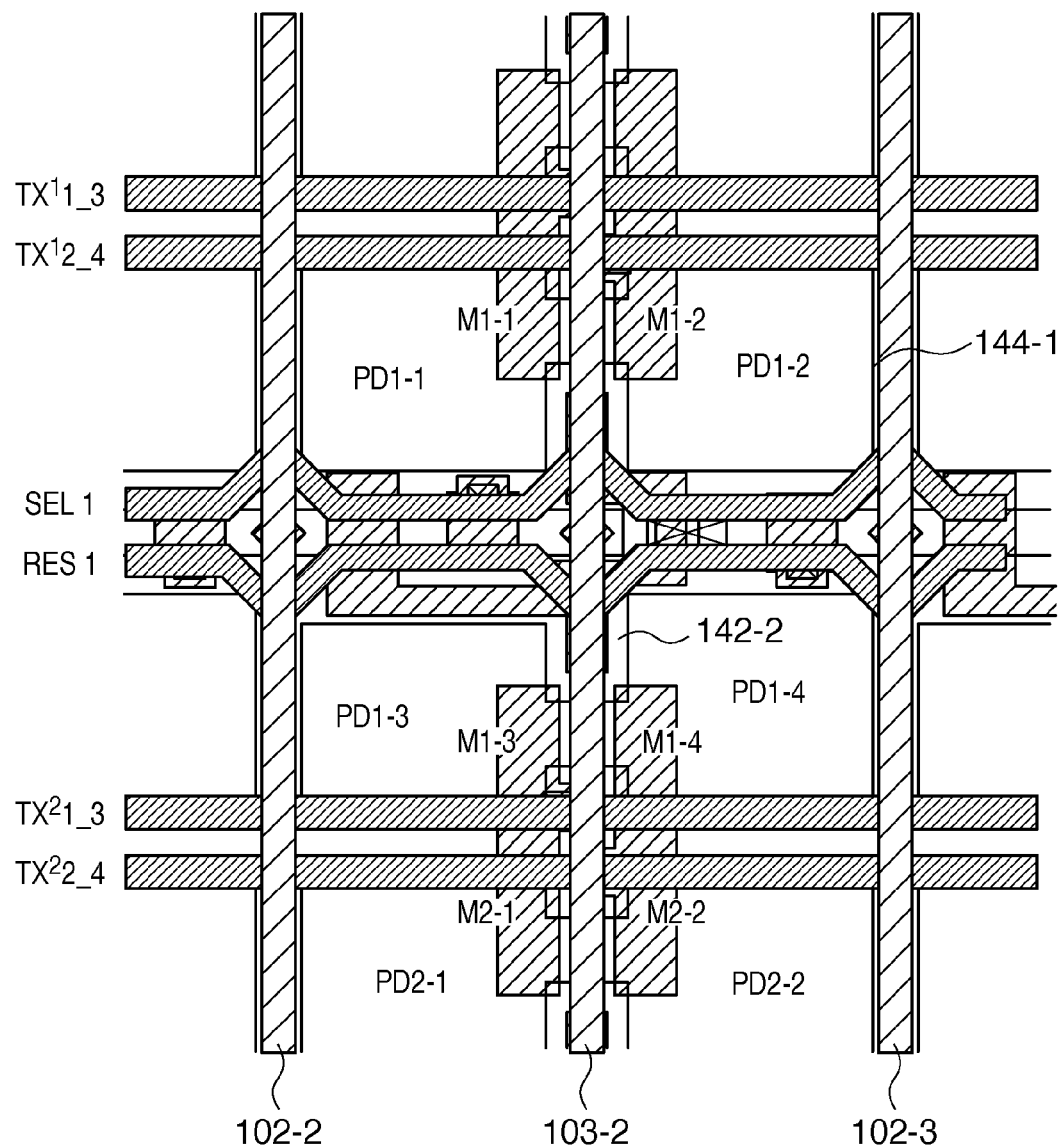
FIG. 18 is a plan view obtained by further placing the second wiring layer ML2 on the plan view of FIG. 17.

Next, an image sensing device 300 according to a third embodiment of the present invention will be described with reference to FIGS. 15 to 18. FIG. 15 is a diagram showing a circuit configuration of the image sensing device 300 according to the third embodiment of the present invention. FIG. 16 is a plan view of the pixel unit PU12 and its surroundings when viewed with the second wiring layer ML2, through-hole plugs 115, and first wiring layer ML1 (see FIG. 3) removed. FIG. 17 is a plan view obtained by further placing the through-hole plugs 115 and first wiring layer ML1 on the plan view of FIG. 16. FIG. 18 is a plan view obtained by further placing the second wiring layer ML2 on the plan view of FIG. 17. Differences from the first embodiment will mainly be described below.

As shown in FIGS. 15 to 18, a drain of the amplification transistor M1-6 is connected directly to the vertical power supply line 102-2 without involving the select transistor M1-5. Instead, a source of the amplification transistor M1-6 is connected to the vertical signal line 103-2 via the select transistor M1-5.

Compared to the first embodiment (see FIG. 2), as shown in FIG. 16, relative left/right positions of the select transistor M1-5 and amplification transistor M1-6 are exchanged, changing the layout of the transistors. This reduces spacing between wiring made of the polycrystalline silicon region 150-2 and the select transistor M1-5. The reduced spacing can make the area of the light-receiving surface of the photoelectric conversion unit PD1-3 smaller than those of the other photoelectric conversion units PD1-1, PD1-2, and PD1-4. In the case of shrunken pixels in a single-plate color image sensor with a pixel pitch of 2 μm or less, the smallest refraction is caused by blue, which has the shortest wavelength among RGB (red, green, blue) lights. Thus, when color filters are arranged in a Bayer array, the arrangement in FIG. 6 can be shifted such that the blue color filter 132 will be assigned to the photoelectric conversion unit PD1-3. Consequently, such an assignment can reduce sensitivity differences among pixels of different colors.

This circuit configuration can reduce the influence of voltage drops caused by the select transistor M1-5 on power supply voltage supplied to the drain of the amplification transistor M1-6. Consequently, drain voltage of the amplification transistor M1-6 can be equalized with the power supply voltage, making the circuit less subject to influence of variation in the select transistor M1-5.

Figure 19:
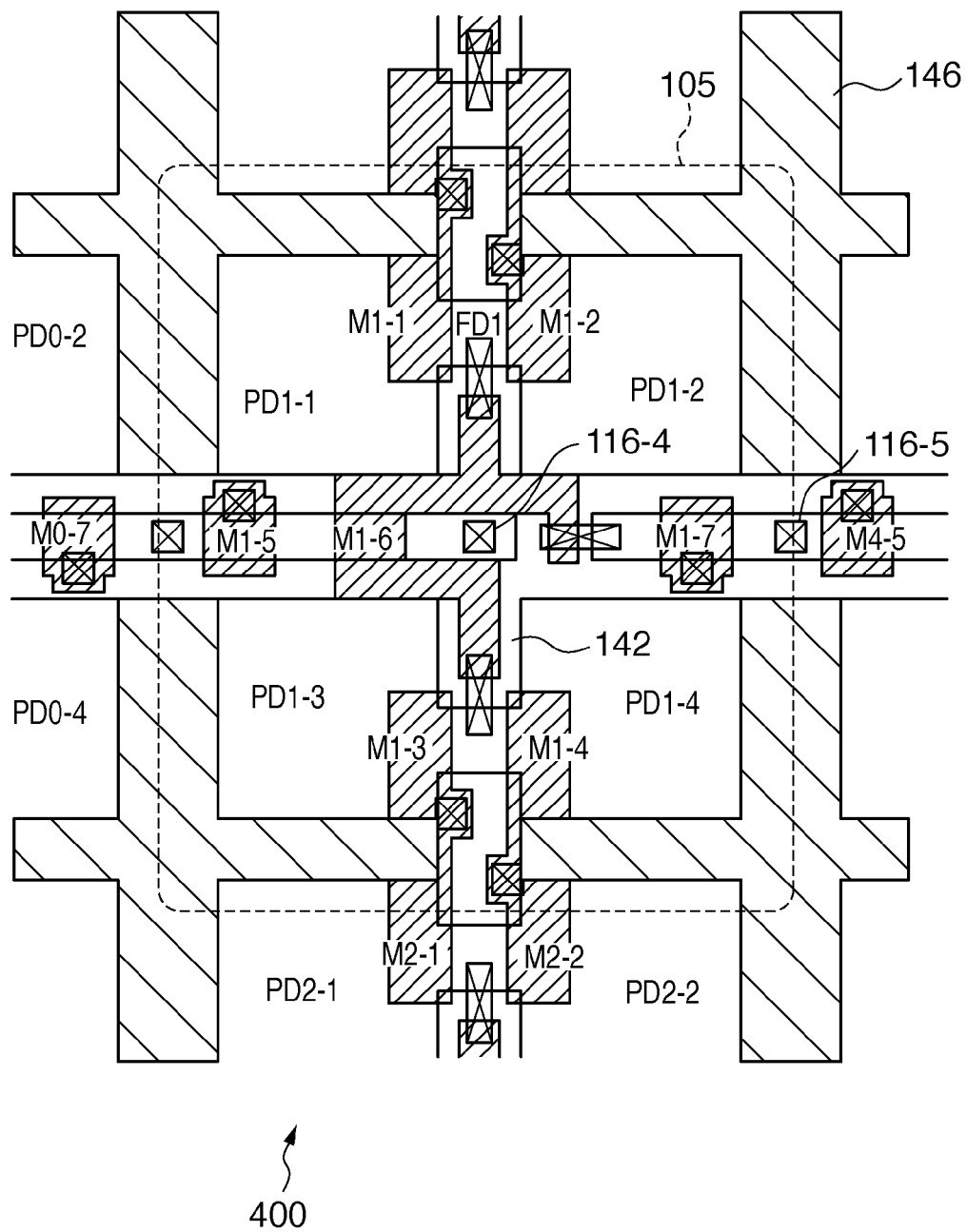
FIG. 19 is a plan view of a pixel unit PU12 according to a fourth embodiment of the present invention and its surroundings when viewed with a second wiring layer ML2, through-hole plugs 115, and a first wiring layer ML1 (see FIG. 3) removed.

Next, an image sensing device 400 according to a fourth embodiment of the present invention will be described with reference to FIG. 19. FIG. 19 is a plan view of a pixel unit PU12 according to the fourth embodiment of the present invention and its surroundings when viewed with the second wiring layer ML2, through-hole plugs 115, and first wiring layer ML1 (see FIG. 3) removed. Differences from the first embodiment will mainly be described below.

Reference numeral 146 denotes a p-type semiconductor region containing p-type impurities such as boron. A photoelectric conversion unit PD0-4 on the left side as viewed from the photoelectric conversion unit PD1-3 is isolated from the photoelectric conversion unit PD2-1 under the photoelectric conversion unit PD1-3 in a plane direction of the photoelectric conversion unit PD1-3 using the p-type semiconductor region 146 rather than a field oxide region 142 (see FIG. 2).

In this way, since the p-type semiconductor region 146 is used for isolation of the photoelectric conversion units (n-type semiconductor regions), it is possible to reduce isolation distance and increase the light-receiving surfaces itself of the photoelectric conversion units. This makes it possible to improve the sensitivity of the image sensing device, reduce the F-value dependence of the light incident upon the image sensing device, and prevent reduction in the amount of light around pixels.

Figure 20:
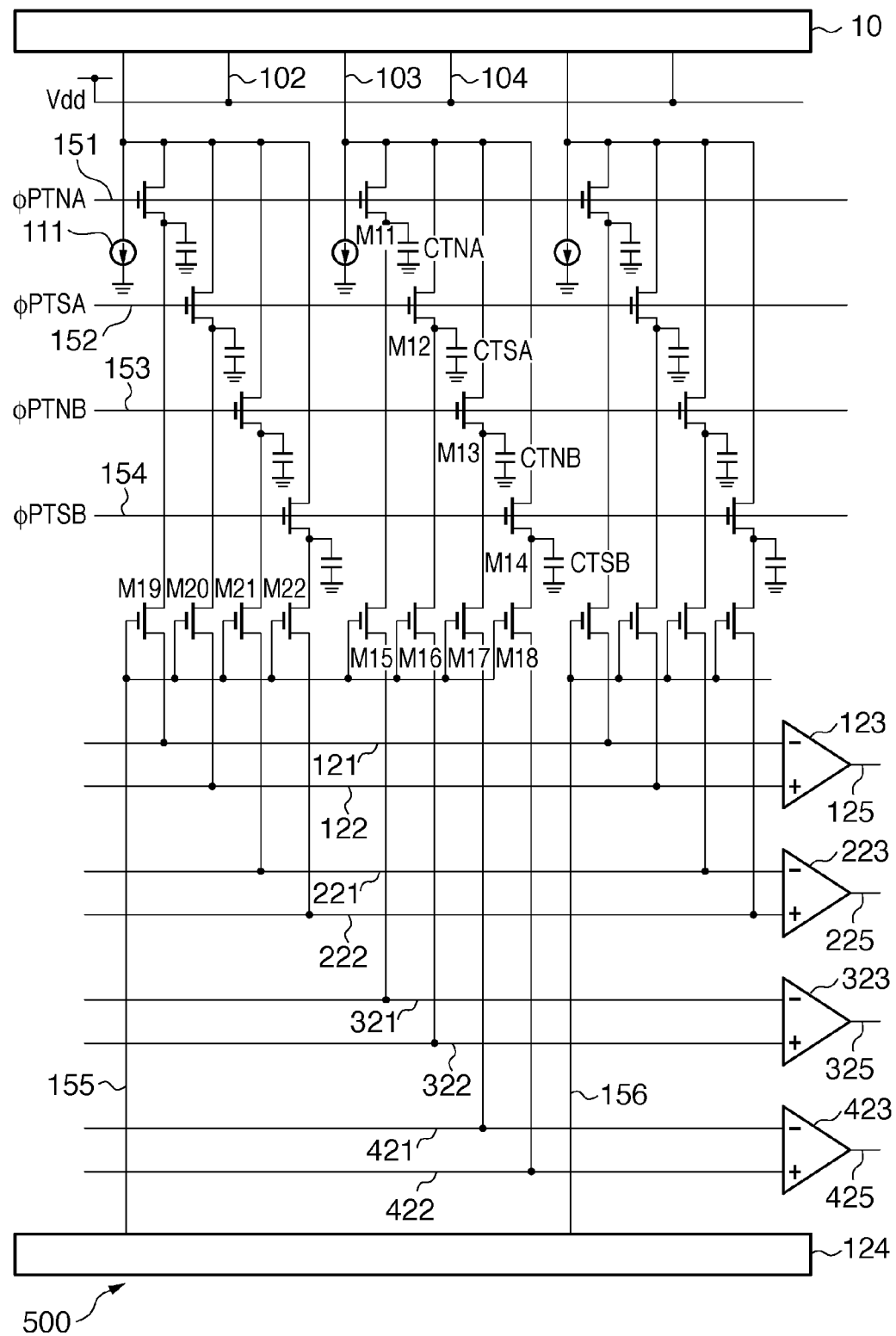
FIG. 20 is a diagram showing a circuit configuration of an image sensing device 500 according to a fifth embodiment of the present invention.

Next, an image sensing device 500 according to a fifth embodiment of the present invention will be described with reference to FIG. 20. FIG. 20 is a diagram showing a circuit configuration of the image sensing device 500 according to the fifth embodiment of the present invention. Differences from the first embodiment will mainly be described below.

In FIG. 20, reference numerals 122, 222, 322, and 422 denote luminance-level horizontal signal lines. Reference numerals 121, 221, 321, and 421 denote noise-level horizontal signal lines. Reference numerals 123, 223, 323, and 423 denote output amplifiers. Reference numerals 125, 225, 325, and 425 denote external signal terminals. Reference numerals M15 to M22 denote horizontal output transistors.

The horizontal scanning circuit 124 turns on eight horizontal output transistors M15 to M22 per control line simultaneously. For example, when a control pulse (horizontal transfer signal) is input in the control line 155 of the horizontal scanning circuit, the horizontal output transistors M15 to M22 turn on simultaneously.

Consequently, four luminance-level signals and four noise-level signals are transferred simultaneously to four output amplifiers 123, 223, 323, and 423. Then, the output amplifiers 123, 223, 323, and 423 subtract the four noise-level signals from the four luminance-level signals and simultaneously output four image signals from four external signal terminals 125, 225, 325, and 425. Such multi-channel output is advantageous in increasing a frame rate when outputting image signals of all pixels.

It should be noted that the isolation of the p-type semiconductor region 146 according to the fourth embodiment may be applied to the second or third embodiment.

Also, the driving method according to the fifth embodiment may be applied to the second to fourth embodiments.

The wiring layers (the first wiring layer and second wiring layer) in the multilayer wiring structure may be made of a metal or intermetallic compound composed principally of copper advantageous for refinement of wiring using a damascene process.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-269183, filed Oct. 17, 2008 which is hereby incorporated by reference herein in its entirety.

What is claimed is:

1. An image sensing device comprising:

a semiconductor substrate which has an image sensing region on which a pixel unit array is placed with a plurality of pixel units arranged in a horizontal direction and a vertical direction, each of the plurality of pixel units having a plurality of photoelectric conversion units including at least two photoelectric conversion units adjacent to each other in the horizontal direction and two photoelectric conversion units adjacent to each other in the vertical direction, a charge-voltage converter which converts charges into voltage, a plurality of transfer transistors which transfer charges generated in the plurality of photoelectric conversion units to the charge-voltage converter, an amplification transistor which outputs a signal corresponding to voltage of the charge-voltage converter, and a reset transistor which resets the charge-voltage converter; and a multilayer wiring structure which defines an aperture region for each of the plurality of photoelectric conversion units in each of the plurality of pixel units, wherein the multilayer wiring structure comprises a first wiring layer placed above the semiconductor substrate so as to define contour sides in a horizontal direction of the aperture region for each of the plurality of photoelectric conversion units, and a second wiring layer placed above the first wiring layer so as to define contour sides in a vertical direction of the aperture region for each of the plurality of photoelectric conversion units, the second wiring layer comprises a plurality of vertical signal lines extending in the vertical direction among the plurality of photoelectric conversion units of the pixel unit to transfer the signal output by the amplification transistor and a plurality of vertical power supply lines extending in the vertical direction between the two pixel units adjacent to each other in the horizontal direction to supply a power supply voltage to the amplification transistor or the reset transistor, and the vertical power supply lines supply the power supply voltage to the reset transistor of the adjacent pixel unit on a first side in the horizontal direction and supply the power supply voltage to the amplification transistor of the adjacent pixel unit on a second side in the horizontal direction.

2. The image sensing device according to claim 1, wherein the second wiring layer is the uppermost wiring layer in the image sensing region.

3. The image sensing device according to claim 1, wherein the semiconductor substrate further comprises a peripheral region which is located around the image sensing region and on which a readout unit is installed to read out a signal from the pixel unit array, the readout unit further comprises two noise-level holding capacitances which hold respective noise levels output by the amplification transistor and transferred via the vertical signal lines in a state where the charge-voltage converter has been reset by the reset transistor, and two luminance-level holding capacitances which hold respective luminance levels output by the amplification transistor and transferred via the vertical signal lines in a state where the charges generated by the photoelectric conversion unit have been transferred to the charge-voltage converter by the transfer transistors.

4. The image sensing device according to claim 1, wherein:
each of the plurality of pixel units further comprises a select transistor which puts the pixel unit in a selected state or deselected state; and
a channel length direction of the amplification transistor, the reset transistor, and the select transistor corresponds to the horizontal direction.

5. The image sensing device according to claim 1, wherein the first wiring layer includes a transfer control line extending in the horizontal direction to supply a control signal to gates of the transfer transistors, and
the transfer control line is shared by two or more of the pixel units adjacent to each other in the horizontal direction.

6. The image sensing device according to claim 1, wherein each of the plurality of pixel units further includes a plurality of color filters corresponding to the plurality of photoelectric conversion units, and
the plurality of color filters forms a Bayer array.

7. An image sensing system comprising:
the image sensing device according to claim 1;
an optical system which forms an image on an image sensing surface of the image sensing device; and
a signal processing unit which processes a signal output by the image sensing device and thereby generates image data.

* * * * *